(12) United States Patent
Park et al.

(10) Patent No.: US 12,369,397 B2
(45) Date of Patent: Jul. 22, 2025

(54) DISPLAY APPARATUS AND METHOD OF MANUFACTURING THE SAME

(71) Applicant: Samsung Display Co., Ltd., Yongin-Si (KR)

(72) Inventors: Geunchul Park, Yongin-si (KR);
Joonseok Park, Yongin-si (KR);
Myounghwa Kim, Yongin-si (KR);
Taesang Kim, Yongin-si (KR);
Yeonkeon Moon, Yongin-si (KR);
Sangwoo Sohn, Yongin-si (KR);
Junhyung Lim, Yongin-si (KR);
Hyelim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 17/368,721

(22) Filed: Jul. 6, 2021

(65) Prior Publication Data
US 2022/0037456 A1   Feb. 3, 2022

(30) Foreign Application Priority Data
Jul. 30, 2020 (KR) .......................... 10-2020-0095580

(51) Int. Cl.
*H01L 27/32*   (2006.01)
*H10D 86/40*   (2025.01)
(Continued)

(52) U.S. Cl.
CPC ....... *H10D 86/441* (2025.01); *H10K 59/1315* (2023.02); *H10K 59/1201* (2023.02); *H10K 71/00* (2023.02)

(58) Field of Classification Search
CPC . H10K 59/1315; H10K 71/00; H10K 59/1201
(Continued)

(56) References Cited

U.S. PATENT DOCUMENTS

| 8,816,998 B2 | 8/2014 | Pyon et al. |
| 9,601,524 B2 | 3/2017 | Tae |

(Continued)

FOREIGN PATENT DOCUMENTS

| KR | 10-2016-0027280 A | 3/2016 |
| KR | 10-2016-0053244 A | 5/2016 |

(Continued)

OTHER PUBLICATIONS

English Machine Translation of KR 2016/0027280 (Year: 2016).*
(Continued)

*Primary Examiner* — Dzung Tran
(74) *Attorney, Agent, or Firm* — Innovation Counsel LLP

(57) ABSTRACT

A display apparatus includes a substrate, a first pixel, a second pixel, a first wire set, and a second wire set. The first pixel and the second pixel overlap the substrate and neighbor each other in a first direction. The first wire set extends in a second direction, includes a first conduction line and a first transmission line, and may transfer a first data signal. The first conduction line is positioned between the substrate and the first transmission line and is connected through the first transmission line to the first pixel. The second wire set extends in the second direction, includes a second conduction line and a second transmission line, and may transfer a second data signal. The second conduction line is positioned between the substrate and the second transmission line and electrically connects the second transmission line to the second pixel.

15 Claims, 22 Drawing Sheets

(51) Int. Cl.
*H10K 59/131* (2023.01)
*H10K 59/12* (2023.01)
*H10K 71/00* (2023.01)

(58) Field of Classification Search
USPC .......................................................... 257/43
See application file for complete search history.

(56) References Cited

U.S. PATENT DOCUMENTS

| | | | |
|---|---|---|---|
| 9,773,454 B2 | 9/2017 | Kim | |
| 10,403,704 B2 | 9/2019 | Chae | |
| 10,446,591 B2 | 10/2019 | Kwon | |
| 11,108,006 B2 | 8/2021 | Kim et al. | |
| 2011/0084337 A1* | 4/2011 | Yamazaki | H01L 27/124 |
| | | | 257/E27.111 |
| 2012/0194757 A1* | 8/2012 | Takasawa | H01L 21/32051 |
| | | | 349/149 |
| 2012/0262659 A1* | 10/2012 | Takasawa | G02F 1/136286 |
| | | | 174/257 |
| 2014/0103317 A1* | 4/2014 | Choi | H01L 27/1255 |
| | | | 257/40 |
| 2014/0342478 A1 | 11/2014 | Choi | |
| 2017/0025447 A1 | 1/2017 | Park et al. | |
| 2017/0294464 A1* | 10/2017 | Kwon | G02F 1/13624 |
| 2018/0108724 A1 | 4/2018 | Lee et al. | |
| 2019/0181360 A1 | 6/2019 | Cha et al. | |

FOREIGN PATENT DOCUMENTS

| | | |
|---|---|---|
| KR | 10-2017-0078075 A | 7/2017 |
| KR | 10-2017-0090559 A | 8/2017 |
| KR | 10-2017-0115641 A | 10/2017 |
| KR | 10-1875127 B1 | 7/2018 |
| KR | 10-2019-0030840 A | 3/2019 |
| KR | 10-2019-0071855 A | 6/2019 |
| KR | 10-2084231 B1 | 3/2020 |

OTHER PUBLICATIONS

Rongsheng Chen et al., "Self-aligned top-gate InGaZnO thin film transistors using SiO2/Al2O3 stack gate dielectric," Thin Solid Films 548, 2013-09-17, pp. 572-575, Elsevier B.V.

Extended European Search Report, Application No. 21186319.6, dated Dec. 23, 2021, 8 pages.

* cited by examiner

DISPLAY APPARATUS AND METHOD OF MANUFACTURING THE SAME

CROSS-REFERENCE TO RELATED APPLICATION(S)

This application claims priority under 35 U.S.C. § 119 to Korean Patent Application No. 10-2020-0095580, filed on Jul. 30, 2020, in the Korean Intellectual Property Office; the Korean Patent Application is incorporated by reference.

BACKGROUND

1. Field

The technical field relates to a display apparatus and a method of manufacturing the display apparatus.

2. Description of Related Art

Modern display apparatuses include organic light-emitting display devices. Organic light-emitting display devices may have wide viewing angles, high contrast, and fast response speeds.

In general, an organic light-emitting display device may include thin-film transistors and organic light-emitting devices arranged on a substrate. An organic light-emitting display device may be included in an electronic device, such as a mobile phone or a television.

SUMMARY

Embodiments may be related to a display apparatus that may be driven at high speed and may be manufactured through simple manufacturing processes. Embodiments may be related to a method of manufacturing the display apparatus.

According to an embodiment, a display apparatus includes a substrate, a first pixel and a second pixel on the substrate, the first and second pixels being adjacent to each other in a first direction, a first wiring on the substrate in a second direction that is perpendicular to the first direction, the first wiring including a first lower line and a first upper line on the first lower line to be electrically connected to the first lower line, and the first wiring being configured to transfer a first data signal input to the first upper line to the first pixel, and a second wiring on the substrate in the second direction, the second wiring including a second lower line and a second upper line on the second lower line to be electrically connected to the second lower line, and the second wiring being configured to transfer a second data signal input to the second lower line to the second pixel.

The first pixel may include a first pixel electrode and a first thin film transistor that is electrically connected to the first pixel electrode and includes a first semiconductor layer and a first gate electrode, and the first semiconductor layer may include an oxide semiconductor material.

The second pixel may include a second pixel electrode and a second thin film transistor that is electrically connected to the second pixel electrode and includes a second semiconductor layer and a second gate electrode, and the second semiconductor layer may include an oxide semiconductor material.

The first lower line may be directly on the first semiconductor layer.

The second lower line may be directly on the second semiconductor layer.

The first thin film transistor and the second thin film transistor may be switching thin film transistors.

The first lower line may include a material that is same as a material in the second lower line.

The first upper line may include a material that is same as a material in the second upper line.

The second pixel may further include a third thin film transistor including a third semiconductor layer and a third gate electrode, and a bridge line on the second lower line, wherein an end of the bridge line may be electrically connected to the second thin film transistor and an opposite end is electrically connected to the third thin film transistor.

The end of the bridge line may be connected to the third gate electrode of the third thin film transistor, and the opposite end of the bridge line may be electrically connected to the second semiconductor layer of the second thin film transistor.

A conductive pattern may be directly on the third semiconductor layer, and the opposite end of the bridge line may be directly connected to the conductive pattern.

The conductive pattern may include a material that is same as a material in the second lower line.

The opposite end of the bridge line may be directly connected to the third semiconductor layer of the third thin film transistor.

The display apparatus may further include a back metal layer between the substrate and the second semiconductor layer, the back metal layer corresponding to the second semiconductor layer.

The upper line may be connected to the back metal layer.

The display apparatus may further include a first gate insulating layer between the first semiconductor layer and the first gate electrode, and a second gate insulating layer between the second semiconductor layer and the second gate electrode, wherein the first gate insulating layer may have the same pattern as the first gate electrode, and the second gate insulating layer may have the same pattern as the second gate electrode.

According to an embodiment, a method of manufacturing a display apparatus includes forming a first semiconductor layer of a first pixel and a second semiconductor layer of a second pixel on a substrate, forming a first data line at a side of the first semiconductor layer, the first data line including a first lower line and a first upper line electrically connected to the first lower line, forming a second data line at a side of the second semiconductor layer, the second data line including a second lower line and a second upper line electrically connected to the second lower line, forming a first gate insulating layer and a first gate electrode on the first semiconductor layer, forming a second gate insulating layer and a second gate electrode on the second semiconductor layer, and forming an interlayer insulating layer covering the first gate electrode and the second gate electrode, wherein the first data line is configured to transfer a first data signal to the first pixel via the first upper line and the second data line is configured to transfer a second data signal to the second pixel via the second lower line.

The first upper line may be on the interlayer insulating layer, and a contact hole may be formed in the interlayer insulating layer to make the first upper line in direct contact with the first semiconductor layer.

The second lower line may be in direct contact with the first semiconductor layer.

The forming of the second lower line may include applying a semiconductor material layer on the substrate, applying a conductive material layer on the semiconductor material layer, forming a photosensitive pattern on the conductive material layer, etching the semiconductor material layer and the conductive material layer, except for a region wherein the photosensitive pattern is arranged, partially removing the photosensitive pattern, and partially removing the conductive material layer on the semiconductor material layer.

The forming of the photosensitive pattern may include forming a first portion having a first thickness and a second portion having a second thickness less than the first thickness by half-tone exposing the photosensitive pattern.

The partial removing of the photosensitive pattern may include partially removing the first portion of the photosensitive pattern and entirely removing the second portion of the photosensitive pattern.

The partial removing of the photosensitive pattern may include entirely etching the photosensitive pattern by the second thickness.

The partial removing of the conductive material layer may include removing a portion of the conductive material layer, the portion corresponding to the second portion of the photosensitive pattern.

The second upper line and the first upper line may include a same material.

The method may further include, before the forming of the first semiconductor layer and the second semiconductor layer, forming a back metal layer on the substrate.

The first semiconductor layer and the second semiconductor layer may include an oxide semiconductor material.

The first gate insulating layer may be simultaneously patterned when the first gate electrode is patterned, and the second gate insulating layer may be simultaneously patterned when the second gate electrode is patterned.

An embodiment may be related to a display apparatus. The display apparatus may include a substrate, a first pixel, a second pixel, a first wire set, and a second wire set. The first pixel and the second pixel may overlap the substrate and may neighbor each other in a first direction. The first wire set may overlap the substrate, may be lengthwise in a second direction different from (e.g., perpendicular to) the first direction, may include a first conduction line and a first transmission line, and may transfer a first data signal to the first pixel. The first conduction line may be positioned between the substrate and the first transmission line and may be electrically connected through the first transmission line to the first pixel. The second wire set may overlap the substrate, may be lengthwise in the second direction, may include a second conduction line and a second transmission line, and may transfer a second data signal to the second pixel. The second conduction line may be positioned between the substrate and the second transmission line and may electrically connect the second transmission line to the second pixel.

The first pixel may include a first pixel electrode and a first thin film transistor. The first thin film transistor may be electrically connected to the first pixel electrode and may include a first semiconductor layer and a first gate electrode. The first semiconductor layer may be formed of an oxide semiconductor material.

The second pixel may include a second pixel electrode and a second thin film transistor. The second thin film transistor may be electrically connected to the second pixel electrode and may include a second semiconductor layer and a second gate electrode. The second semiconductor layer may be formed of the oxide semiconductor material.

The display apparatus may include a semiconductor member formed of the oxide semiconductor material. The first conduction line may be positioned directly on the semiconductor member.

The second conduction line may be positioned directly on the second semiconductor layer.

The first thin film transistor and the second thin film transistor may be switching thin film transistors.

A material of the first conduction line may be identical to a material of the second conduction line.

A material of the first transmission line may be identical to a material in the second transmission line.

The second pixel may include the following elements: a third thin film transistor including a third semiconductor layer and a third gate electrode; and a bridge line electrically connected to each of the second thin film transistor and the third thin film transistor. A first end of the bridge line may overlap the third semiconductor. A second end of the bridge line may overlap the second semiconductor.

The second end of the bridge line may be electrically connected through the first end of the bridge line to the third gate electrode. The first end of the bridge line may be electrically connected through the second end of the bridge line to the second semiconductor layer.

A conductive member may be positioned directly on the second semiconductor layer. The second end of the bridge line may be directly connected to the conductive member.

A material of the conductive member may be identical to a material of the second conduction line.

The second end of the bridge line may be directly connected to the second semiconductor layer.

The display apparatus may include a back metal layer between the substrate and the second semiconductor layer. The back metal layer may overlap the second semiconductor layer.

The display apparatus may include the following elements: a back metal layer; and a driving voltage line electrically connected to the back metal layer. The second pixel may include a third thin film transistor. The third thin film transistor may include a third semiconductor layer and a third gate electrode. The back metal layer may be positioned between the substrate and the third semiconductor and may overlap the third semiconductor layer.

The display apparatus may include the following elements: a first gate insulating layer between the first semiconductor layer and the first gate electrode; and a second gate insulating layer between the second semiconductor layer and the second gate electrode. A shape of the first gate insulating layer may be identical to a shape of the first gate electrode. A shape of the second gate insulating layer may be identical to a shape of the second gate electrode.

An embodiment may be related to a method for manufacturing a display apparatus. The method may include the following steps: on a substrate, forming a first semiconductor layer and a second semiconductor layer for a first pixel and a second pixel, respectively; forming a first data line, the first data line including a first conduction line and a first transmission line; forming a second data line, the second data line including a second conduction line and a second transmission line; forming a first gate insulating layer and a first gate electrode on the first semiconductor layer; forming a second gate insulating layer and a second gate electrode on the second semiconductor layer; and forming an interlayer insulating layer covering the first gate electrode and the second gate electrode. The first conduction line may be positioned between the substrate and the first transmission line and may be electrically connected through the first transmission line to the first pixel (or the first semiconductor layer). The second conduction line may be positioned between the substrate and the second transmission line and electrically connects the second transmission line to the second pixel (or the second semiconductor layer).

The first transmission line may be partially positioned on the interlayer insulating layer. A contact hole may be formed in the interlayer insulating layer. The first transmission line may be partially positioned inside the contact hole to direct contact the first semiconductor layer.

The second conduction line may directly contact the second semiconductor layer.

The method may include the following steps: providing a semiconductor material layer on the substrate; providing a conductive material layer on the semiconductor material layer; forming a photosensitive member on the conductive material layer; etching portions of the semiconductor material layer and the conductive material layer that are not covered by the photosensitive member; partially removing the photosensitive member; and partially removing the conductive material layer.

The method may include half-tone exposing a photosensitive material layer to form the photosensitive member. The photosensitive member may include a first face, a second face, and a third face. Each of the first face and the second face may overlap the third face and may be parallel to the third face. A minimum distance between the first face and the third face may be greater than a minimum distance between the second face and the third face.

The method may include the following steps: removing the first face when removing the second face; and retaining a portion of the third face that is overlapped by the first face when removing a portion of the third face that is overlapped by the second face.

The method may include reducing a thickness of the photosensitive member by the minimum distance between the second face and the third face.

The method may include removing a portion of the conductive material layer that is overlapped by the second face of the photosensitive member.

The second transmission line and the first transmission line may include a same material.

The method may include, before forming the first semiconductor layer and the second semiconductor layer, forming a back metal layer on the substrate.

The first semiconductor layer and the second semiconductor layer include an oxide semiconductor material.

The first gate insulating layer may be patterned when the first gate electrode is patterned. The second gate insulating layer may be patterned when the second gate electrode is patterned.

BRIEF DESCRIPTION OF THE DRAWINGS

Each of FIG. 8, FIG. 9.

DETAILED DESCRIPTION

Figure 1:
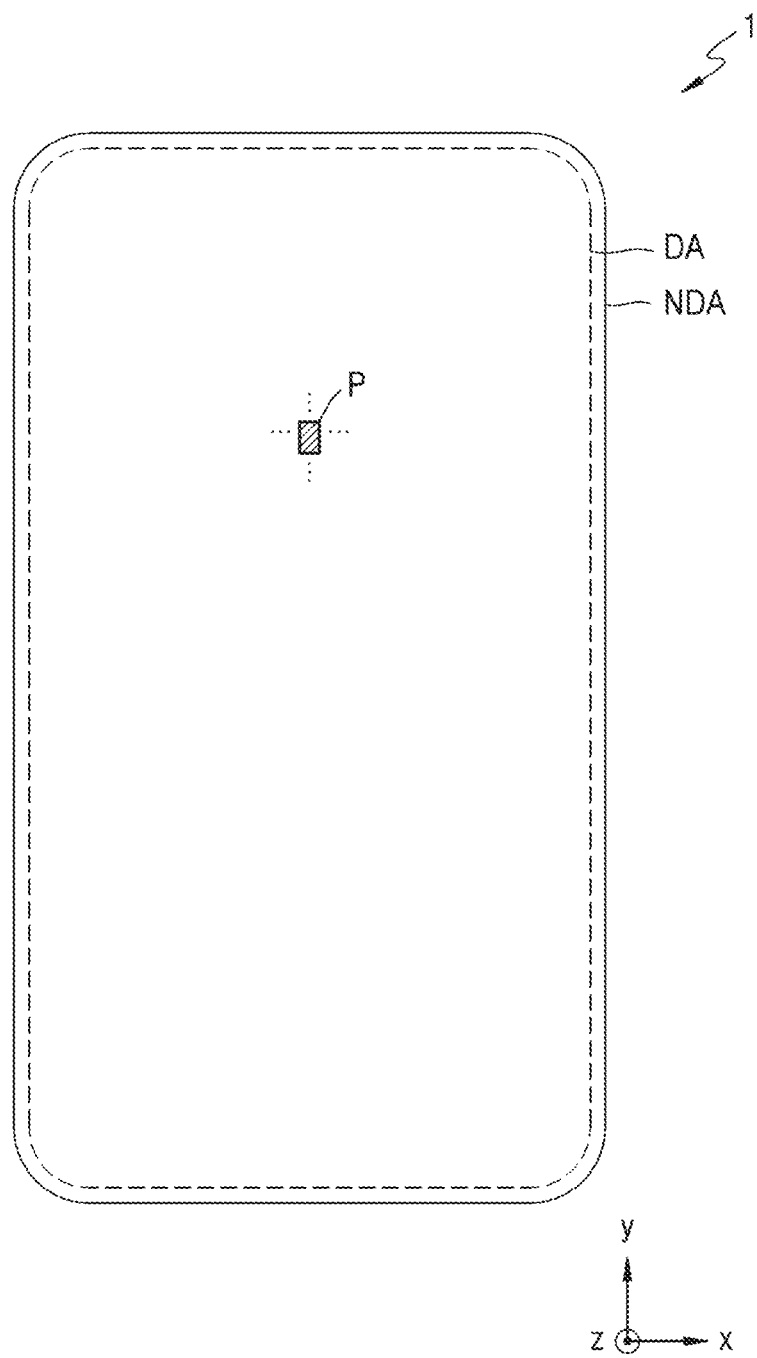
FIG. 1 is a plan view of a display apparatus according to an embodiment.

Example embodiments are described with reference to the accompanying drawings. Like reference numerals may refer to like elements. The example embodiments may have different forms and should not be construed as being limited to the description.

Although the terms "first," "second," etc., may be used to describe various elements, such elements should not be limited to these terms. The above terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

An expression used in the singular may encompass the expression of the plural, unless it has a clearly different meaning in the context.

The terms "including," "having," and "comprising" may not preclude one or more elements not explicitly stated.

When a first element is referred to as being "on" a second element, the first element may be directly or indirectly on the second element. One or more intervening elements may be present between the first element and the second element.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." The term "wiring" may mean "wire set." The term "pattern" may mean "member." The term "adjacent to" may mean "neighboring" or "immediately neighboring." A "lower" element may be closer to a substrate than an "upper" element is. The expression that an element is lengthwise in an indicated direction or that the element extends in the indicated direction may mean that the lengthwise direction of the element is the indicated direction. A listing of materials may mean at least one of the listed materials. The term "portion" may mean "section" with a substantially uniform thickness.

The x-axis, the y-axis, and the z-axis may or may not be perpendicular to one another and/or may represent different directions.

Process steps may be performed in an order different from the described order. For example, two described process steps may be performed substantially at the same time or may be performed in an order opposite to the described order.

Dimensions in the drawings may be exaggerated or reduced for convenience of explanation.

Figure 2:
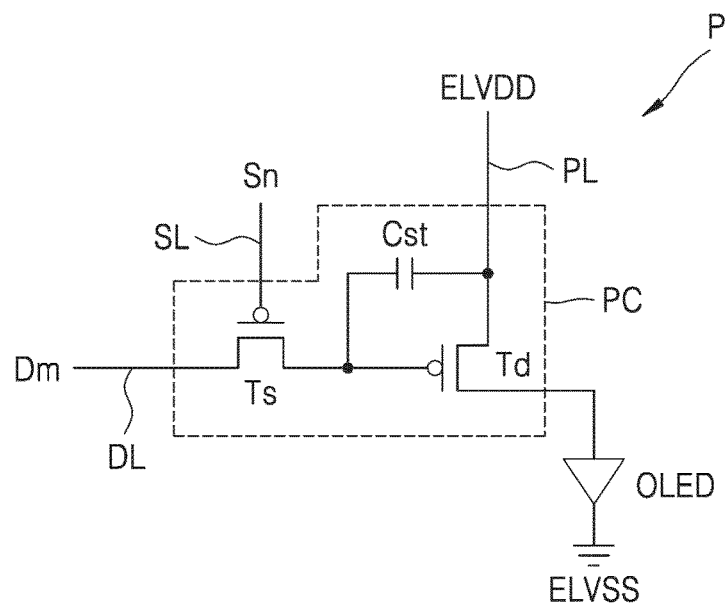
FIG. 2 is an equivalent circuit diagram of a pixel included in a display apparatus according to an embodiment.

FIG. 1 is a plan view of a display apparatus 1 according to an embodiment, and FIG. 2 is an equivalent circuit diagram of a pixel that may be included in the display apparatus 1 according to the embodiment.

Referring to FIG. 1, the display apparatus 1 includes a display area DA and a peripheral area NDA. The display area DA may display image according input signals. The peripheral area NDA may not display images according to input signals. The display apparatus 1 may display images using light emitted from pixels P arranged in the display area DA.

In FIG. 1, the display area DA may have a polygonal shape (e.g., a rectangular shape, a square shape, a triangle shape, or a pentagon shape), a circular shape, or an elliptical shape. The display area DA may have a substantially rectangular shape having rounded corners and/or may have a notch at a side.

The display apparatus 1 may be a flat panel display apparatus. The display apparatus 1 may be flexible, bendable, foldable, or rollable. When the display apparatus 1 is flexible, bendable, or foldable, the display area DA may be entirely or partially flexible, bendable, or foldable.

The display apparatus 1 may be an organic light-emitting display apparatus. The display apparatus 1 may be/include at least one of an inorganic light-emitting display apparatus, an inorganic electroluminescence (EL) display apparatus, a quantum dot light-emitting display apparatus, etc. An emission layer of a display element included in the display apparatus 1 may include an organic material, an inorganic material, quantum dots, an organic material and quantum dots, or an inorganic material and quantum dots.

Referring to FIG. 2, a pixel P includes a pixel circuit PC connected to a driving voltage line PL, a scan line SL, and a data line DL, and includes an organic light-emitting diode OLED connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL and transfers a data signal Dm input through the data line DL to the driving thin film transistor Td according to a scan signal Sn input through the scan line SL.

The storage capacitor Cst is connected to the switching thin film transistor Ts and a driving voltage line PL and stores a voltage corresponding to a difference between a voltage transferred from the switching thin film transistor Ts and a driving voltage, that is, a first power voltage (e.g., ELVDD), supplied to the driving voltage line PL.

The driving thin-film transistor Td is connected to the lower driving voltage line PL and the storage capacitor Cst and may control a driving current flowing from the lower driving voltage line PL to the organic light-emitting diode OLED in response to the voltage value stored in the storage capacitor Cst. The organic light-emitting diode OLED may emit light having a certain luminance according to driving current.

FIG. 2 shows an example in which the pixel circuit PC includes two thin film transistors and one storage capacitor. The pixel circuit PC may include seven thin film transistors and one storage capacitor. The pixel circuit PC may include two or more storage capacitors.

Figure 3:
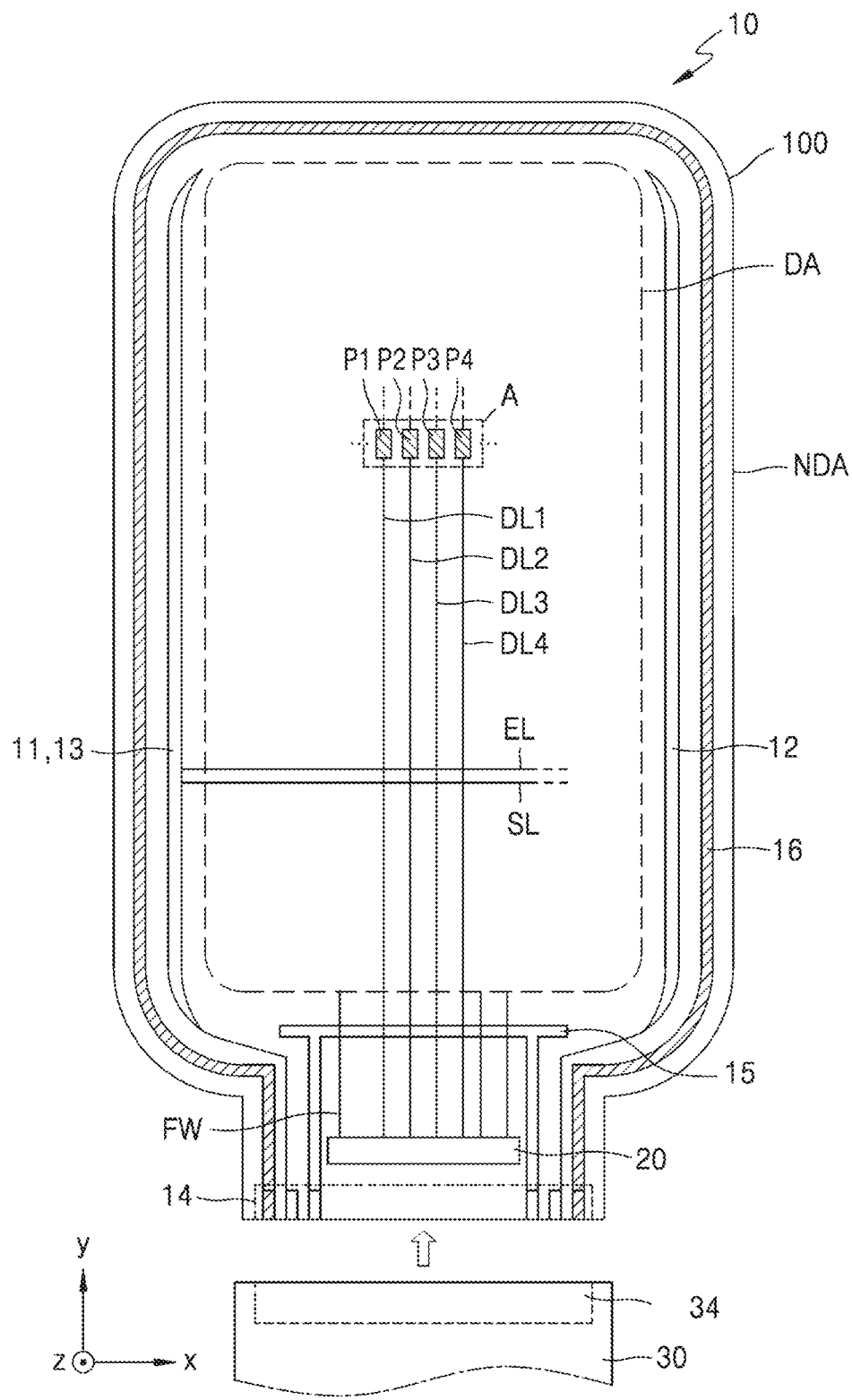
FIG. 3 is a plan view of a display panel according to an embodiment.
Figure 4:
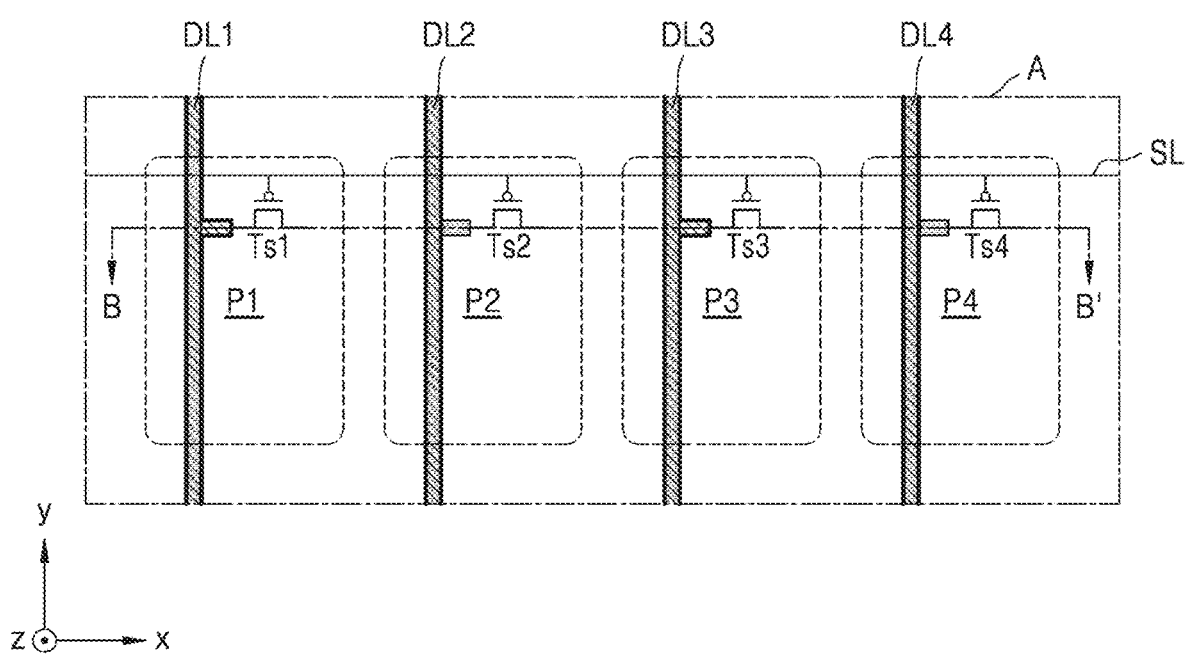
FIG. 4 is a plan view showing a portion A in FIG. 3 according to an embodiment.
Figure 5:
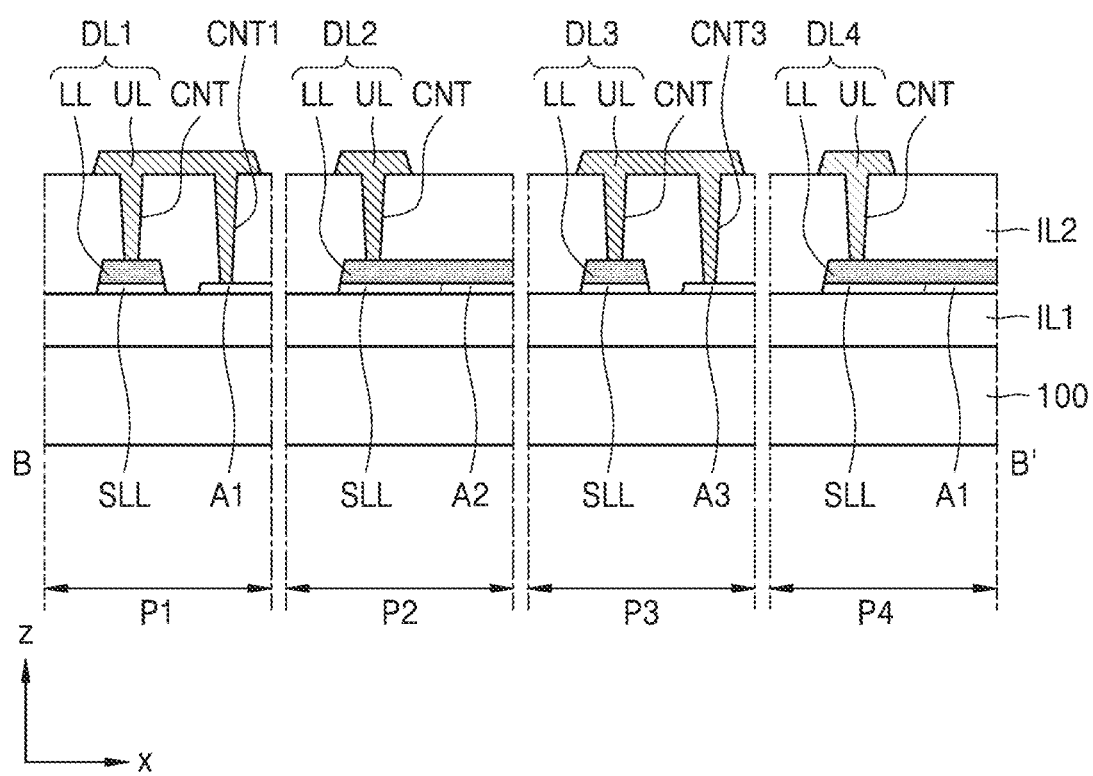
FIG. 5 is a cross-sectional view of the display panel taken along line B-B' of FIG. 4 according to an embodiment.

FIG. 3 is a plan view of a display panel 10 according to an embodiment, and FIG. 4 is a plan view showing a portion A in FIG. 3. FIG. 5 is a cross-sectional view of the display panel 10 taken along line B-B' of FIG. 4.

Referring to FIG. 3, various elements of the display panel 10 are on the substrate 100. Pixels P1 to P4 are in the display area DA. Each of the pixels P1 to P4 may be a sub-pixel, and may include a display element such as an organic light-emitting diode OLED. Each of the pixels P1 to P4 may emit, for example, red light, green light, blue light, or white light.

Each of the pixels P1 to P4 may be electrically connected to circuits in the peripheral area NDA, that is, the non-display area. A first scan driving circuit 11, a second scan driving circuit 12, an emission control driving circuit 13, a terminal 14, a first power supply line 15, and a second power supply line 16 may be in the peripheral area NDA.

The first scan driving circuit 11 may provide the pixels P1 to P4 with a scan signal via a scan line SL. The second scan driving circuit 12 may be arranged parallel to the first scan driving circuit 11 with the display area DA being positioned between the scan driving circuits 11 and 12. Some of the pixels P1 to P4 in the display area DA may be electrically connected to the first scan driving circuit 11, and the other pixels may be connected to the second scan driving circuit 12. The second scan driving circuit 12 may be optional.

The emission control driving circuit 13 is at a side of the first scan driving circuit 11, and may provide each of the pixels P1 to P4 with an emission control signal via an emission control line EL. In FIG. 3, the emission control driving circuit 13 is only at one side of the display area DA, but emission control driving circuits 13 may be positioned at opposite sides of the display area DA, like the first and second scan driving circuits 11 and 12.

The terminal 14 may be in the peripheral area NDA of the substrate 100. The terminal 14 may not be exposed and may be electrically connected to a printed circuit board 30. A terminal 34 of the printed circuit board 30 may be electrically connected to the terminal 14 of the display panel 10.

The printed circuit board 30 is configured to transfer a signal or power from a controller (not shown) to the display panel 10. Control signals generated by the controller may be transferred to the first scan driving circuit 11, the second scan driving circuit 12, and the emission control driving circuit 13 via the printed circuit board 30. The controller may provide the first and second power supply lines 15 and 16 with the first power voltage ELVDD (see FIG. 2) and a second power voltage ELVSS (see FIG. 2). The first power voltage ELVDD is supplied to each of the pixels P1 to P4 via the driving voltage line PL connected to the first power supply line 15, and the second power voltage ELVSS may be provided to an opposite electrode of each of the pixels P1 to P4 connected to the second power supply line 16. The first power supply line 15 may extend in one direction (e.g., x-direction) outside the display area DA. The second power supply line 16 has a loop shape having an opening and may partially surround the display area DA.

The data driver 20 generates data signals, which are transferred through fan-out wires FW and then data lines DL1 to DL4 to the pixels P1 to P4.

The first data line DL1, the second data line DL2, the third data line DL3, and the fourth data line DL4, may be respectively connected to the first pixel P1, the second pixel P2, the third pixel P3, and the fourth pixel P4. The lengthwise direction of each of the data lines DL1, DL2, DL3, and DL4 may be the y-direction. The first to fourth pixels P1 to P4 are arranged adjacent to one another in one direction (e.g., x-direction). The expression 'arranged adjacent to one another' may mean that the pixels are successively arranged and are close to one another. The first pixel P1 receives a first data signal through the first data line DL1, the second pixel P2 receives a second data signal through the second data line DL2, the third pixel P3 receives a third data signal through the third data line DL3, and the fourth pixel P4 receives a fourth data signal through the fourth data line DL4. FIGS. 3 to 5 show four data lines DL1 to DL4 for convenience of description. More than four data lines may be successively arranged in the display area DA.

Referring to FIGS. 4 and 5, the data lines DL1 to DL4 may each include a lower line LL and an upper line UL. The lower line LL and the upper line UL may be electrically connected to each other. The lower line LL and the upper line UL may entirely or partially overlap each other. A second insulating layer IL2 between the lower line LL and the upper line UL may include an opening of a valley shape or a contact hole CNT as shown in FIG. 5. Because each of the data lines DL1 to DL4 has a dual-wire structure including the lower line LL and the upper line UL, a resistance in each of the data lines DL1 to DL4 may be minimized, and a structure suitable for high speed driving may be effectively implemented.

Data signals may be respectively and lastly transferred to switching thin film transistors Ts1 and Ts3 of the pixels P1 and P3 via the upper lines UL of the first data line DL1 and the third data line DL3. Data signals may be respectively and lastly transferred to switching thin film transistors Ts2 and Ts4 of the pixels 2 and 4 via the lower lines LL of the second data line DL2 and the fourth data line DL4.

The upper line UL in each of the first data line DL1 and the third data line DL3 may protrude beyond the corresponding lower line LL in one direction (e.g., +x-direction) and may be directly connected to the first semiconductor layer A1 and a third semiconductor layer A3 via contact holes CNT1 and CNT3 positioned in a second insulating layer IL2. The lower line LL in each of the second data line DL2 and the fourth data line DL4 may protrude beyond the corresponding upper line UL in one direction (e.g., +x-direction) and may be directly connected to a second semiconductor layer A2 and a fourth semiconductor layer A4. The lower lines LL in the second data line DL2 and the fourth data line DL4 may substantially overlap the second semiconductor layer A2 and the fourth semiconductor layer A4.

A sub-lower layer SLL may be under the lower line LL. The sub-lower layer SLL may include the same material as these semiconductor layers A1 to A4. The lower line LL may be obtained through the same mask process for manufacturing the semiconductor layers A1 to A4 and the sub-lower layers SLL, and thus may overlap the semiconductor layers and/or the sub-lower layers SLL.

When the display apparatus is driven at high speed (e.g., 120 Hz or greater), an RC delay may occur due to a difference between charging and discharging speeds of the pixel circuit. To minimize the delay, the performance of the data driver may be improved, or a thickness of the data line may be increased to reduce the resistance. However, there is a limitation in increasing the performance of the data driver or increasing the thickness of the data line. According to embodiments, each of the first to fourth data lines DL1 to DL4 may have a dual-wire structure, and data signals may be alternately finally applied via the upper line UL and the lower line LL. Advantageously, the RC delay of the pixel circuit may be effectively minimized during high speed driving.

As shown in FIG. 5, the upper lines UL of the first data line DL1 and the third data line DL3 are partially positioned on the second insulating layer IL2 and partially extend into the second insulating layer IL2 to be connected to the first semiconductor layer A1 and the third semiconductor layer A3 via the contact holes CNT1 and CNT3.

The lower lines LL of the second data line DL2 and the fourth data line DL4 may be in direct contact with the second semiconductor layer A2 and the fourth semiconductor layer A4. That is, the lower lines LL may extend beyond the corresponding upper lines UL and may directly contact the second semiconductor layer A2 and the fourth semiconductor layer A4. The sub-lower layers SLL under the lower lines LL may also extend beyond the corresponding upper lines UL and may directly contact the second semiconductor layer A2 and the fourth semiconductor layer A4. The sub-lower layers SLL may be integrally provided with the second and fourth semiconductor layers A2 and A4.

Figure 7:
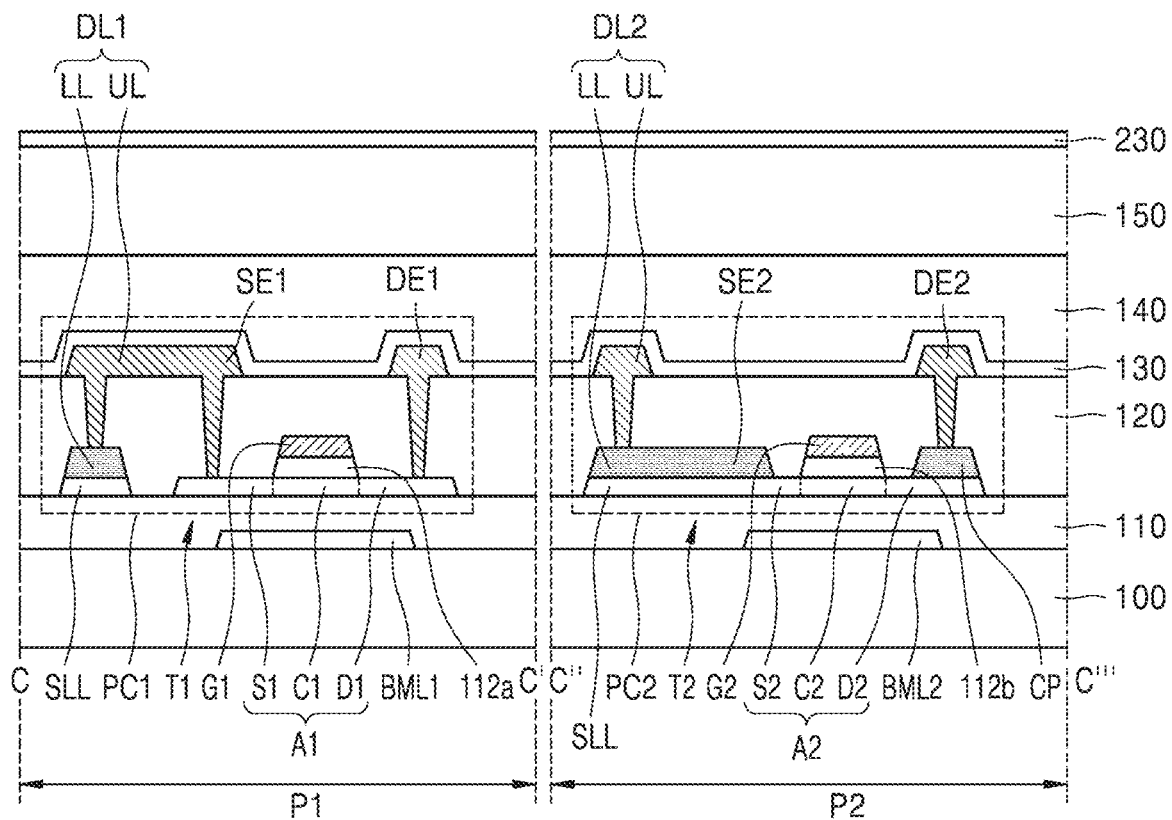
FIG. 7 is a cross-sectional view of the first and second pixels taken along line C-C' and line C"-C'" of FIG. 6 according to an embodiment.

In FIG. 5, the first insulating layer IL1 correspond to a buffer layer 110 illustrated in FIG. 7, and the second insulating layer IL2 may correspond to a gate insulating layer 120 illustrated in FIG. 7.

During the manufacturing processes, the lower line LL and the second semiconductor layer A2 (or the fourth semiconductor layer A4) may be simultaneously patterned. As such, the data lines DL1 to DL4 may be easily implemented to have the dual-wire structure without adding a process for manufacturing the lower line LL.

The upper lines UL of the first to fourth data lines DL1 to DL4 are on the second insulating layer IL2, and may be respectively connected to the lower lines LL via contact holes CNT. The same signal may be applied to an upper line UL and the corresponding lower line LL, and the upper line UL may reduce a resistance of the data line and/or may transfer the signal.

Each of the pixels P1 to P4 may include a driving voltage line. The driving voltage line may extend in a direction (e.g., y-direction) that is the same as a direction in which each of the data lines DL1 to DL4 extends. The driving voltage line may be on the second insulating layer IL2 at the same layer as the upper line UL. All or some of the driving voltage lines may be positioned directly on one or more layers. The driving voltage line may have a dual-wire structure, like the data lines DL1 to DL4.

Figure 6:
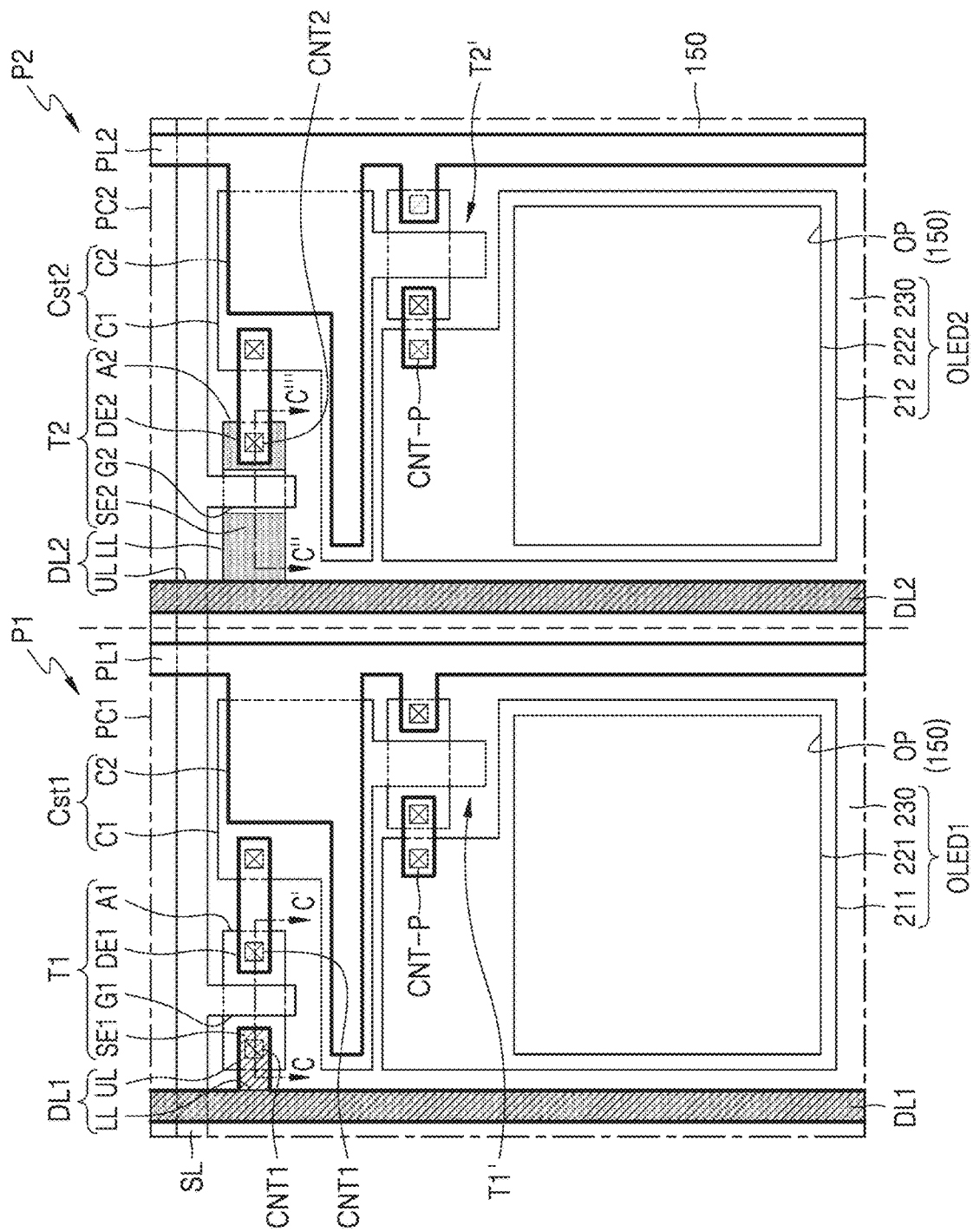
FIG. 6 is a plan view showing a first pixel and a second pixel of a display apparatus according to an embodiment.
Figure 8:
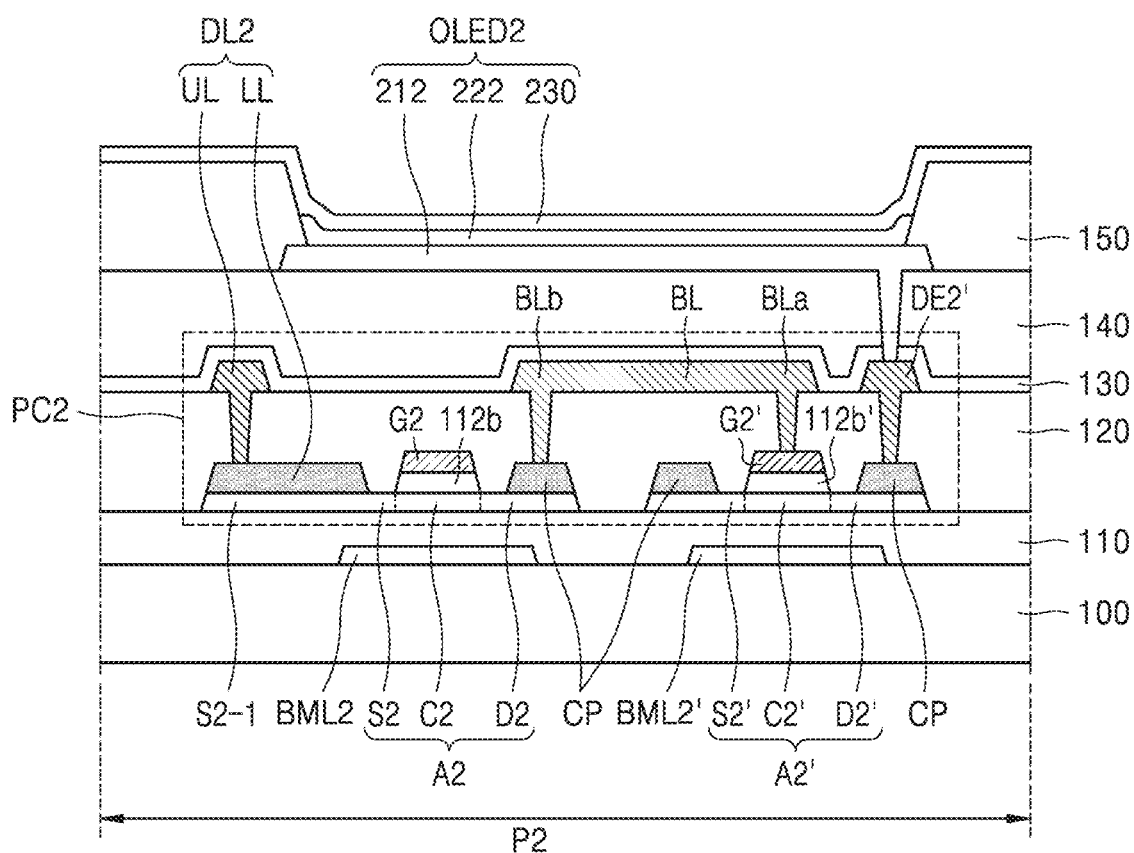
Figure 9:
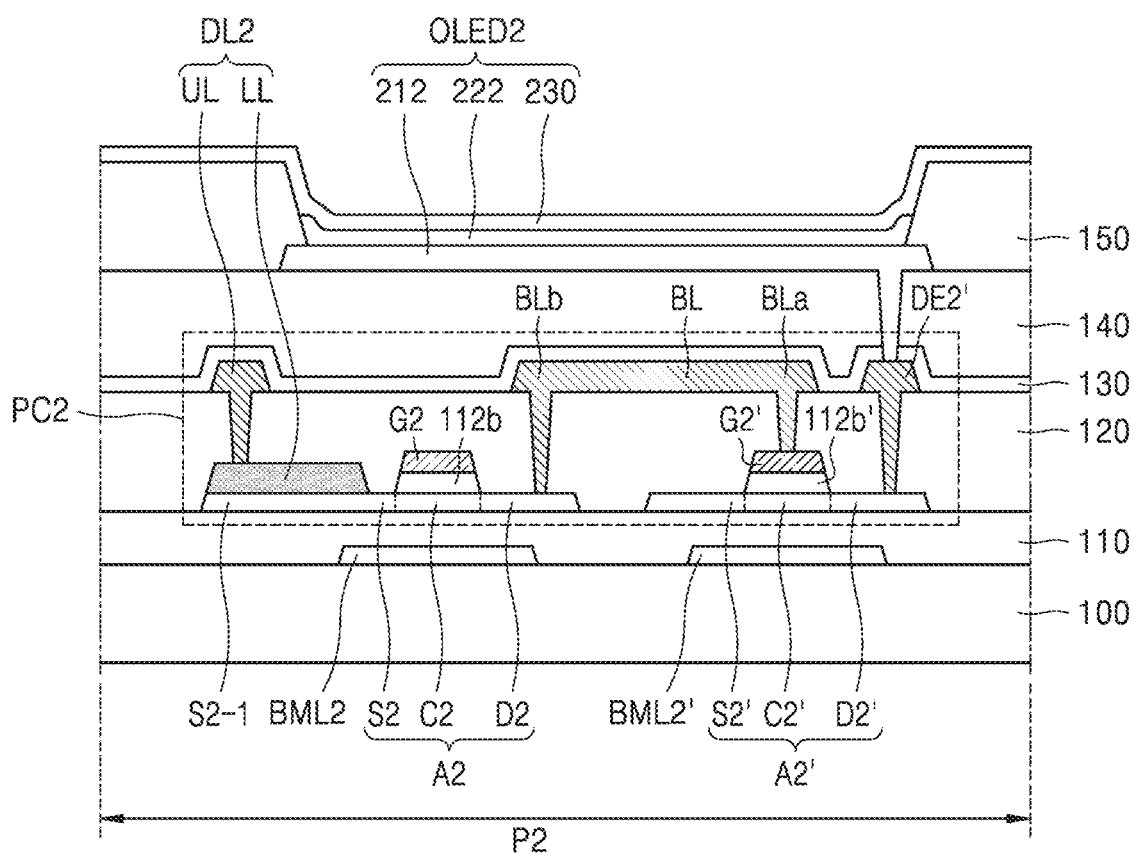
Figure 10:
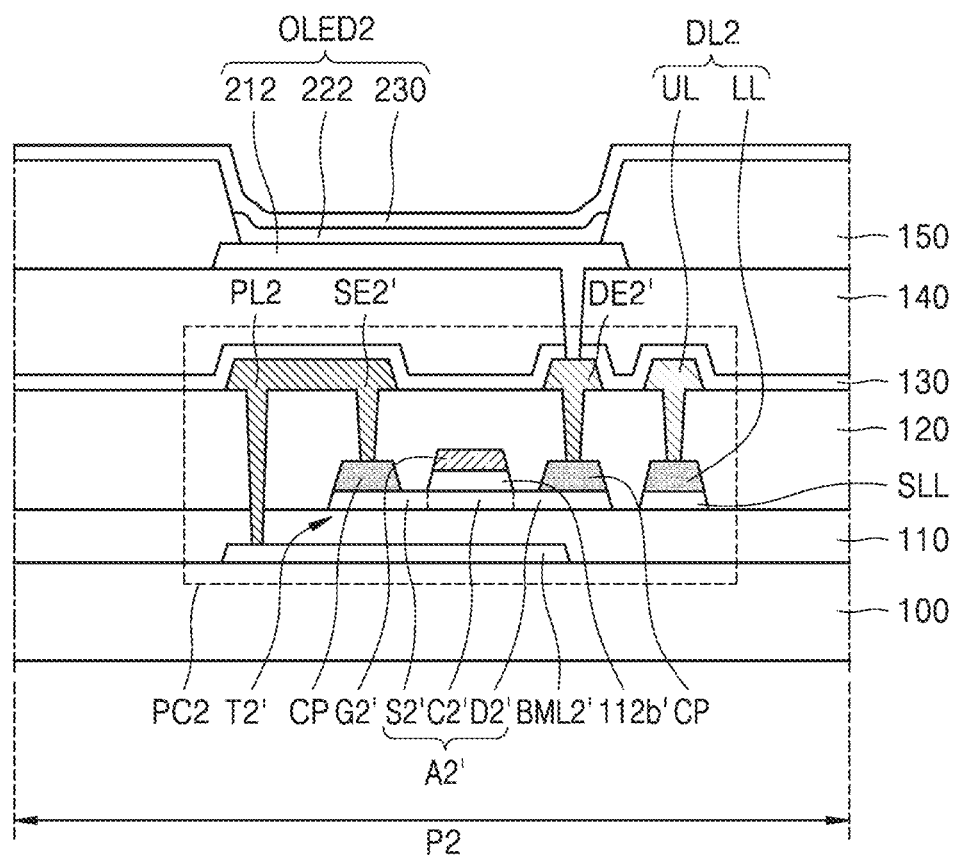
FIG. 10 is a cross-sectional view of a second pixel in a display apparatus according to an embodiment.

FIG. 6 is a plan view showing a first pixel P1 and a second pixel P2 of a display apparatus according to an embodiment, and FIG. 7 is a cross-sectional view of the first and second pixels taken along line C-C' and line C"-C" of FIG. 6. Each of FIG. 8, FIG. 9, and FIG. 10 is a cross-sectional view of the second pixel P2 according to an embodiment.

Referring to FIG. 6, each of a first pixel circuit PC1 and a second pixel circuit PC2 includes two thin film transistors (that is, a driving thin film transistor T1/T2' and a switching thin film transistor T1/T2) and one storage capacitor Cst1/Cst2.

Referring to FIG. 3, FIG. 6, and FIG. 7, the first pixel P1 and the second pixel P2 may be adjacent to each other in the x-direction on the substrate 100. The first pixel P1 and the second pixel P2 may be respectively electrically connected to the first data line DL1 and the second data line DL2 that are separated from each other in the x-direction and extend in the y-direction.

The substrate 100 may include a glass material, a metal material, or a polymer resin. The polymer resin may include, for example, at least one of polyethersulfone, polyacrylate, polyetherimide, polyethylene n naphthalate, polyethylene terephthalate, polyphenylene sulfide, polyarylate, polyimide, polycarbonate, cellulose acetate propionate, etc. The substrate 100 may include at least one organic base layer (including an organic material) and at least one inorganic base layer.

A first back metal layer BML1 and a second back metal layer BML2 may overlap and correspond to the first pixel P1 and the second pixel P2, respectively. The first back metal layer BML1 and the second back metal layer BML2 may be directly on the substrate 100, or may be on a barrier layer that is provided closer to the substrate 100 in the z-direction. The first back metal layer BML1 and the second back metal layer BML2 are between the thin film transistors T1, T1', T2, and T2' of the first and second pixels P1 and P2 and the substrate 100 to stabilize the pixel circuits. The first back metal layer BML1 and the second back metal layer BML2 may each include at least one of aluminum (Al), platinum (Pt), palladium (Pd), argentum (Ag), magnesium (Mg), aurum (Au), nickel (Ni), iridium (Ir), chromium (Cr), lithium (Li), calcium (Ca), molybdenum (Mo), titanium (Ti), tungsten (W), and/or copper (Cu). Each of the back metal layers BML1 and BML2 may have a single-layered structure or a multi-layered structure including one or more of the above stated materials.

A constant voltage or a signal may be applied to each of the first back metal layer BML1 and the second back metal layer BML2 to prevent the pixel circuit from being damaged due to electrostatic discharge. The first back metal layer BML1 and the second back metal layer BML2 corresponding to different pixels, e.g., the first pixel P1 and the second pixel P2, may be respectively provided with different voltages.

The buffer layer 110 may be on the first back metal layer BML1 and the second back metal layer BML2. The buffer layer 110 may provide a flat surface over the first and second semiconductor layers A1 and A2 and may insulate the first and second back metal layers BML1 and BML2 from the first and second semiconductor layers A1 and A2. The buffer layer 160 may include silicon nitride ($SiN_x$), silicon oxide ($SiO_x$), and/or silicon oxynitride (SiON).

The first pixel circuit PC1 of the first pixel P1 and the second pixel circuit PC2 of the second pixel P2 may be on the buffer layer 110.

Referring to FIG. 6, the first pixel circuit PC1 may include the first driving thin film transistor T1', the first switching thin film transistor T1, the first storage capacitor Cst1, the first data line DL1, and the first driving voltage line PL1. The second pixel circuit PC2 may include the second driving thin film transistor T2', the second switching thin film transistor T2, the second storage capacitor Cst2, the second data line DL2, and the second driving voltage line PL2. The scan line SL may be shared by the first pixel circuit PC1 and the second pixel circuit PC2. Each of the first and second storage capacitors Cst1 and Cst2 may include a first electrode E1 and a second electrode E2 overlapping each other.

Referring to FIGS. 6 and 7, a switching semiconductor layer (the first semiconductor layer A1) of the first switching thin film transistor T1 and a switching semiconductor layer (the second semiconductor layer A2) of the second switching thin film transistor T2 may be on the buffer layer 110, and may respectively include channel regions C1 and C2, and source regions S1 and S2 and drain regions D1 and D2 doped with impurities. The source regions S1 and S2 and the drain regions D1 and D2 may respectively act as source electrodes and drain electrodes.

The first semiconductor layer A1 and the second semiconductor layer A2 may each include an oxide semiconductor material. The semiconductor layers A1 and A2, the source regions S1 and S2, and/or the drain regions D1 and D2 may include at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn), and a metal oxide. The metal oxide may be/include at least one of zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc. The first semiconductor layer A1 and the second semiconductor layer A2 may each include low temperature polysilicon (LTPS) or amorphous silicon.

A first gate electrode G1 and a second gate electrode G2 may be respectively on the first semiconductor layer A1 and the second semiconductor layer A2. When the first semiconductor layer A1 and the second semiconductor layer A2 include an oxide semiconductor material, a first gate insulating layer 112a between the first semiconductor layer A1 and the first gate electrode G1 and a second gate insulating layer 112b between the second semiconductor layer A2 and the second gate electrode G2 may be respectively patterned to have shapes identical/similar to the shapes of the first and second gate electrodes G1 and G2. The first gate electrode G1 and the second gate electrode G2 include at least one of molybdenum (Mo), aluminum (Al), copper (Cu), titanium (Ti), etc., and may each have a single-layered structure or a multi-layered structure.

The first gate insulating layer 112a and the second gate insulating layer 112b may expose the source regions S1 and S2 and the drain regions D1 and D2 of the first and second semiconductor layers A1 and A2. Exposed portions of the source regions S1 and S2 and the drain regions D1 and D2 may be in direct contact with an interlayer insulating layer 120. The source regions S1 and S2 and the drain region D1 and D2 may increase mobility of charges in the first and second semiconductor layers A1 and A2 via hydrogen diffused from the interlayer insulating layer 120. The first gate insulating layer 112a and the second gate insulating layer 112b may each include an inorganic insulating material such as silicon oxide ($SiO2$), silicon nitride ($SiNx$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The interlayer insulating layer 120 may cover the first gate electrode G1 and the second gate electrode G2. Because the first gate insulating layer 112a and the second gate insulating layer 112b expose the source regions S1 and S2 and the drain regions D1 and D2 of the first and second semiconductor layers A1 and A2, the interlayer insulating layer 120 may be at least partially in direct contact with the source regions S1 and S2 and the drain regions D1 and D2 of the first and second semiconductor layers A1 and A2. The interlayer insulating layer 120 may direct contact side surfaces of the first gate insulating layer 112a and the second gate insulating layer 112b.

The interlayer insulating layer 120 may include a single-layered or multi-layered structure including an organic material and/or an inorganic material. For example, when the interlayer insulating layer 120 includes an organic material, the interlayer insulating layer 120 may include at least one of a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, and vinyl alcohol-based polymer. When the interlayer insulating layer 120 includes an inorganic material, the interlayer insulating layer 120 may include at least one of silicon oxide ($SiO_2$), silicon nitride ($SiNx$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

A first source electrode SE1 and a first drain electrode DE1 electrically connected to the first semiconductor layer A1 are on the interlayer insulating layer 120. A second source electrode SE2 and a second drain electrode DE2 electrically connected to the second semiconductor layer A2 may be on the interlayer insulating layer 120. The first source electrode SE1 and the first drain electrode DE1 are in contact with the first semiconductor layer A1 via contact holes in the interlayer insulating layer 120, but the second drain electrode DE2 may be electrically connected to the second semiconductor layer A2 via a conductive pattern CP on the second semiconductor layer A2, and the second source electrode SE2 may be directly on the second semiconductor layer A2. The first source electrode SE1 may be a part extending from the upper line UL of the first data line DL1, and the second source electrode SE2 may be a part extending from the lower line LL of the second data line DL2.

The first pixel circuit PC1 connected to the first pixel P1 may include the first data line DL1. The first data line DL1 may be provided to have a dual-wire structure including the upper line UL and the lower line LL. The sub-lower layer SLL may be under the lower line LL. The upper line UL of the first data line DL1 may be on the interlayer insulating layer 120, and may include a material that is the same as a material of the first source electrode SE1 and the first drain electrode DE1. The first data line DL1 may lastly transfer the data signal to the first pixel P1 via the upper line UL.

The second pixel circuit PC2 connected to the second pixel P2 may include the second data line DL2. The second data line DL2 may have a dual-wire structure, in which the upper line UL is on the lower line LL. In each of the first data line DL1 and the second data line DL2, the lower line LL may be directly connected to the sub-lower layer SLL that is under the lower line LL.

In the second pixel P2, the conductive pattern CP may be on the drain region D2 of the second semiconductor layer A2. The conductive pattern CP may be simultaneously obtained with the lower line LL, and the lower line LL may include the same material as that of the conductive pattern CP on the drain region D2. The lower line LL and the conductive pattern CP may each include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) in a single-layered or multi-layered structure.

The first data line DL1 and the second data line DL2 may reduce resistances by means of the upper lines UL. The first data line DL1 may transfer a first data signal to the first pixel P1 via the upper line UL (lastly).

The upper line UL in each of the first data line DL1 and the second data line DL2 may include, for example, Al, Pt, Pd, Ag, Mg, Au, Ni, Nd, Ir, Cr, Li, Ca, Mo, Ti, W, and/or Cu, and may have a single-layered or multi-layered structure.

The first data line DL1 and the second data line DL2 respectively connected to the neighboring pixels P1 and P2 may each have a dual-wire structure, the first pixel P1 may receive the first data signal lastly via the upper line UL of the first data line DL1, and the second pixel P2 may receive a second data signal lastly via the lower line LL of the second data line DL2. Because the data line in each pixel has the dual-wire structure and because data signals may be alternately input to the upper line UL and the lower line LL between the adjacent pixels, the RC delay potentially caused by the difference between the charging and discharging speeds of the pixel circuit may be effectively prevented/minimized when the display apparatus is driven at a high speed (e.g., 120 Hz or greater).

A protective layer 130 may be provided to cover the upper lines UL in the first data line DL1 of the first pixel P1 and in the second data line DL2 of the second pixel P2. The protective layer 130 may prevent impurities introduced from the substrate 100 from infiltrating into the organic light-emitting diode. The protective layer 130 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A planarization layer 140 for planarizing an upper surface over pixel electrodes 211 and 212 may be provided on the protective layer 130. The planarization layer 140 may include a single-layered or multi-layered structure including an organic material. The planarization layer 140 may include at least one of a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, and vinyl alcohol-based polymer.

Referring to FIG. 6 and FIG. 7, a first organic light-emitting diode OLED1 of the first pixel P1 and a second organic light-emitting diode OLED2 of the second pixel P2 may be on the planarization layer 140.

The first pixel electrode 211 and the second pixel electrode 212 may be on the planarization layer 140. The first pixel electrode 211 and the second pixel electrode 212 may each include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 211 and the second pixel electrode 212 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or an alloy of some of the metals. The pixel electrode 210 may further include at least one layer including ITO, IZO, ZnO, or $In_2O_3$ on and/or under the reflective layer. The first pixel electrode 211 and the second pixel electrode 212 may each have a structure in which ITO, Ag, and ITO layers are stacked.

A pixel defining layer 150 may partially cover each of the first pixel electrode 211 and the second pixel electrode 212. The first pixel defining layer 150 overlaps each of the first pixel electrode 211 and the second pixel electrode 212, and includes an opening OP defining a light emission region of a pixel. The opening OP may be defined as a light emission region in the first pixel P1. The pixel defining layer 150 increases a distance between an edge of each of the first and second pixel electrodes 211 and 212 and an opposite electrode 230 to prevent generation of arc at the edge of the first and second pixel electrodes 211 and 212. The pixel defining layer 150 may include an organic insulating material such as at least one of polyimide, polyamide, an acrylic resin, benzocyclobutene, hexamethyldisiloxane (HMDSO), and a phenol resin, and may be obtained by a spin coating, etc.

Although not shown in the drawings, a first common layer set may cover the pixel defining layer 150. The first common layer set may have a single-layered or multi-layered structure. The first common layer may include a hole transport layer (HTL) having a single-layered structure. The first common layer set may include a hole injection layer (HIL) and the HTL.

A first emission layer 221 and a second emission layer 222 corresponding respectively to the first pixel electrode 211 and the second pixel electrode 212 are on the first common layer. The first emission layer 221 and the second emission layer 222 may each include a polymer material or a low-molecular material, and may emit red light, green light, blue light, or white light.

A second common layer set (not shown) may be on the first emission layer 221 and the second emission layer 222. The second common layer may have a single-layered or multi-layered structure. The second common layer set may include an electron transport layer (ETL) and/or an electron injection layer (EIL). The ETL may be on the first and second emission layers 221 and 222, and the EIL may be on the ETL.

The first common layer and the second common layer may be integrally provided to commonly correspond to the first pixel P1 and the second pixel P2. The first common layer set and/or the second common layer set may be optional.

The opposite electrode 230 is on the first emission layer 221 and the second emission layer 222. The opposite electrode 230 may include a conductive material having a low work function. The opposite electrode 230 may include a (semi) transparent layer, the (semi) transparent layer including Ag, Mg, Al, Pt, Pd, Au, Ni, Nd, Ir, Cr, Li, Ca, and/or an alloy of some of the metals. The counter electrode 230 may further include a layer including ITO, IZO, ZnO, or $In_2O_3$ on the (semi) transparent layer. The opposite electrode 230 may be integrally provided on the display area DA.

FIG. 8 shows the second pixel circuit PC2 of the second pixel P2 according to an embodiment.

Elements other than the second pixel circuit PC2 are the same as or analogous to those of the second pixel P2 described above with reference to one or more of FIG. 1 to FIG. 7. The second pixel circuit PC2 may be referred to as a pixel circuit PC2.

Referring to FIG. 6 and FIG. 8, the pixel circuit PC2 may include a second driving thin film transistor T2' and a second switching thin film transistor T2. The second switching thin film transistor T2 is the same as that shown in FIG. 7.

The second driving thin film transistor T2' may neighbor the second switching thin film transistor T2. Back metal layers BML2 and BML2' may overlap the second switching thin film transistor T2 and the second driving thin film transistor T2'.

A second driving semiconductor layer A2' of the second driving thin film transistor T2' may be on the buffer layer 110, and may include a channel region C2', and may include a source region S2' and a drain region D2' doped with impurities. The source region S2' and the drain region D2' may respectively function as a source electrode and a drain electrode. Like the second switching thin film transistor T2 described above with reference to FIG. 7, the second driving semiconductor layer A2' may include an oxide semiconductor material. The second driving semiconductor layer A2' may include low temperature polysilicon (LTPS) or amorphous silicon.

A second driving gate electrode G2' may be on the channel region C2' of the second driving semiconductor layer A2', and a second gate insulating layer 112b' may be between the second driving semiconductor layer A2' and the second driving gate electrode G2'.

The second driving thin film transistor T2' and the second switching thin film transistor T2 of the second pixel P2 may each include a conductive pattern CP. As shown in FIG. 8, the conductive patterns CP may be directly on the source region S2' and the drain region D2' of the second driving semiconductor layer A2' and directly on the drain region D2 of the second switching semiconductor layer A2, to reduce resistances of related wires and electrodes and/or to improve device characteristics.

A conductive pattern CP on the drain region D2' of the second driving semiconductor layer A2' is electrically connected through a second driving drain electrode DE2' to the second pixel electrode 212.

In an embodiment, as shown in FIG. 9, no or minimum conductive patterns CP may be positioned on the source region S2' and the drain region D2' of the second driving semiconductor layer A2' or the drain region D2 of the second switching semiconductor layer A2. As shown in FIG. 9, the lower line LL on the source region S2 of the second switching semiconductor layer A2 may be provided.

Referring to FIG. 6 and FIG. 8, a bridge line BL may be electrically connected to the second driving thin film transistor T2' and the second switching thin film transistor T2. A first end BLa of the bridge line BL may be directly connected to the second driving gate electrode G2' of the second driving thin film transistor T2', and an opposite, second end BLb of the bridge line BL may be electrically connected to the second switching semiconductor layer A2 of the second switching thin film transistor T2 via the corresponding conductive pattern CP. As shown in FIG. 8, the conductive pattern CP may be directly on the drain region D2 of the second switching semiconductor layer A2, and the second end BLb of the bridge line BL may be electrically connected through the conductive pattern CP to the second switching semiconductor layer A2.

The second data line DL2 may be on a side of the second switching thin film transistor T2. The second data line DL2 may be directly connected to the second switching thin film transistor T2. The lower line LL of the second data line DL2 may be directly on the second switching semiconductor layer A2 of the second switching thin film transistor T2 (e.g., directly on a portion S2-1 extending from the source region S2 of the second switching semiconductor layer A2), and the upper line UL may be on the lower line LL and may be electrically connected to the lower line LL via the contact hole CNT2. The portion S2-1 of the second switching semiconductor layer A2, on which the lower line LL is provided, may be construed to be part of the source region S2.

Referring to FIG. 10, a constant voltage or a signal may be applied to the second back metal layer BML2' of the second pixel P2.

The second back metal layer BML2' may be electrically connected to the second driving voltage line PL2 to receive a driving voltage. Because the constant voltage or signal is applied to the second back metal layer BML2', potential damage to the pixel circuit PC2 due to an electrostatic discharge may be prevented.

The source electrode SE2' of the second driving thin film transistor T2' may be electrically connected to the second driving voltage line PL2. The second driving voltage line PL2 may be integrally provided with the source electrode SE2'. The second driving voltage line PL2 and the source electrode SE2' may or may not be positioned directly on a same insulating layer and/or may be separate and/or insulated from each other.

The second data line DL2 may be at a side of the second driving thin film transistor T2'. The second data line DL2 may include the lower line LL and the upper line UL. The lower line LL and the upper line UL may be connected to each other via a contact hole positioned in the interlayer insulating layer 120. The sub-lower layer SLL may be immediately under the lower line LL.

FIGS. 11A to 21 are cross-sectional views illustrating structures formed in processes in a method of manufacturing a display apparatus according to an embodiment.

The processes involve using masks M1, M2, M3, M4, M5, M6, M7, and M8. Layers (or patterns) obtained from the manufacturing processes may be the same as or analogous to layers (or patterns) described with reference to one or more of FIGS. 1 to 10. Description related to materials and functions of the layers (or patterns) may not be repeated.

Figure 11A:
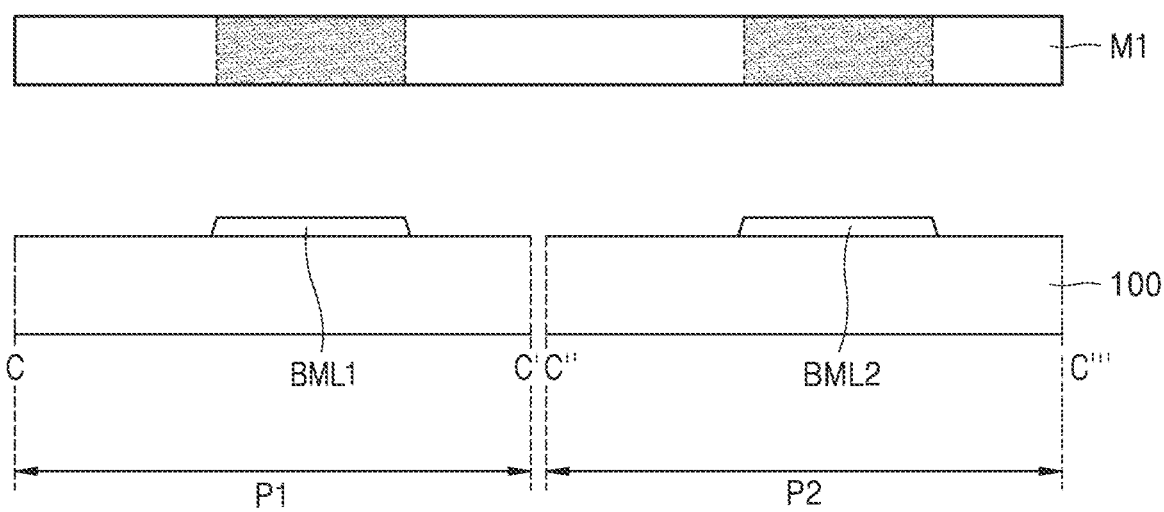
FIG. 11A, FIG. 11B, FIG. 12, FIG. 13, FIG. 14, FIG. 15, FIG. 16, FIG. 17, FIG. 18, FIG. 19, FIG. 20, and FIG. 21 are cross-sectional views illustrating structures formed in processes in a method of manufacturing a display apparatus, according to an embodiment.

Referring to FIG. 11A, the first back metal layer BML1 (corresponding to the first pixel P1) and the second back metal layer BML2 (corresponding to the second pixel P2) may be formed on the substrate 100 using the first mask M1. The first back metal layer BML1 and the second back metal layer BML2 may be directly formed on the substrate 100 or on a barrier layer (including an inorganic material) that is formed on the substrate 100.

Figure 11B:
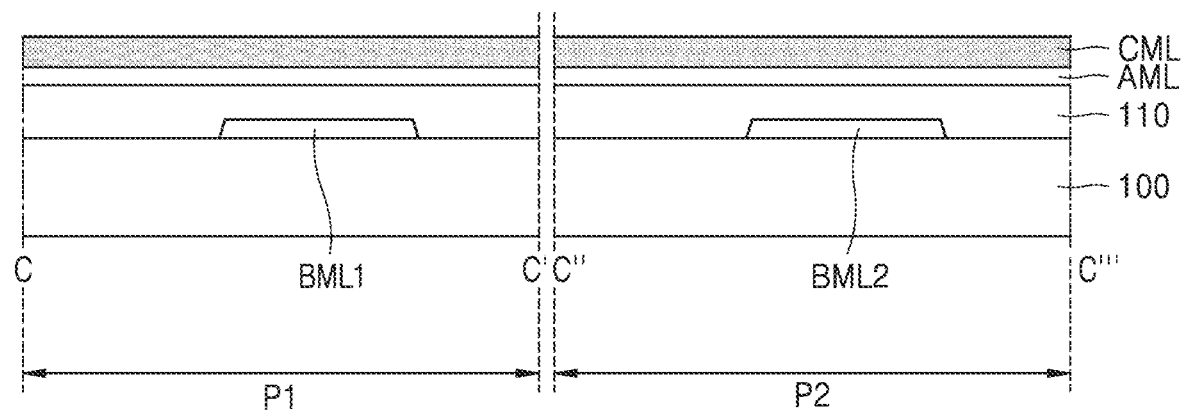

Subsequently, referring to FIG. 11B, the buffer layer 110, a semiconductor material layer AML, and a conductive material layer CML may be sequentially formed on the first back metal layer BML1 and the second back metal layer BML2. The semiconductor material layer AML may include an oxide semiconductor material and/or may include at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn), and a metal oxide. The metal oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc.

The conductive material layer CML may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) in a single-layered or multi-layered structure.

Subsequently, referring to FIG. 12, a first photosensitive pattern PR1 and a second photosensitive pattern PR2 may be formed on the conductive material layer CML using a second mask M2.

The second mask M2 may be a half-tone mask. The second mask M2 may include a transmission portion M21, a semi-transmission portion M22, and a block portion M23. A photosensitive material for forming the first photosensitive pattern PR1 and a second photosensitive pattern PR2 may be deposited on the conductive material layer CML to about a first thickness t2'. In the photosensitive material, a portion corresponding to the transmission portion M21 is removed, and a portion corresponding to the block portion M23 remains on the conductive material layer CML. In the photosensitive material, a portion corresponding to the semi-transmission portion M22 may be partially removed. That 'the photosensitive material is partially removed' may mean that the photosensitive material may be at least partially reduced to a second thickness t2 that is less than the first thickness. The transmission portion M21 of the second mask M2 may be/include an opening; the semi-transmission portion M22 may include a plurality of slits.

The first photosensitive pattern PR1 may correspond to the first pixel P1, and the second photosensitive pattern PR2 may correspond to the second pixel P2. The first photosensitive pattern PR1 corresponds to the semi-transmission portion M22 of the second mask M2, and may be formed by partially etching the photosensitive material. The second photosensitive pattern PR2 corresponds to the semi-transmission portion M22 and the block portion M23 of the second mask M2, may include a first portion a having the first thickness t2', and may include a second portion b having the second thickness t2.

Figure 13:
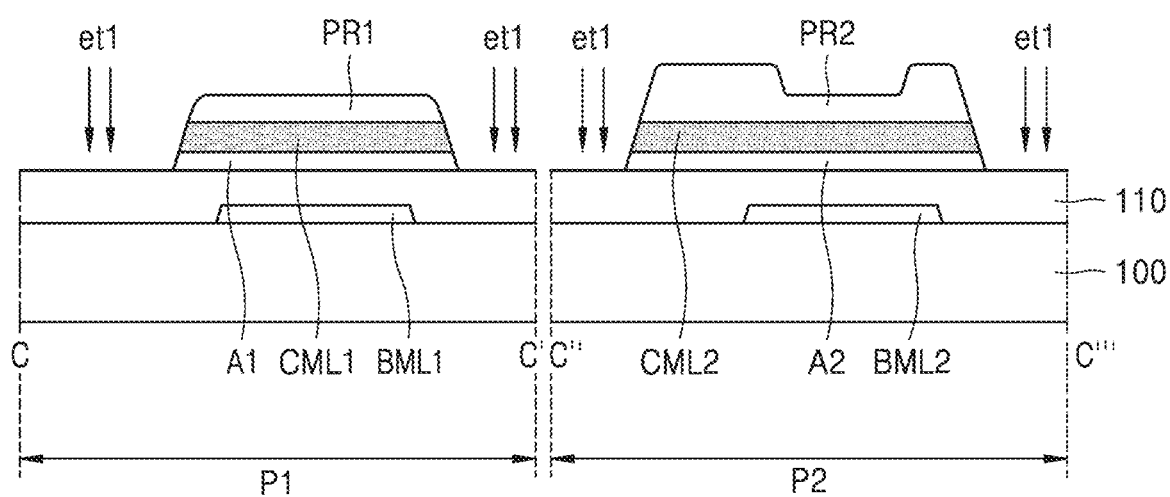

Subsequently, referring to FIG. 13, a first etching process et1 for etching the portions not covered by the first and second photosensitive patterns PR1 and PR2 may be performed using the first and second photosensitive patterns PR1 and PR2 as a mask. The semiconductor material layer AML and the conductive material layer CML may be patterned/etched through the first etching process ep1. The patterned semiconductor material layer AML may form the first and second semiconductor layers A1 and A2, and the patterned conductive material layer CML may form a first conductive material layer CML1 on the first semiconductor layer A1 and a second conductive material layer CML2 on the second semiconductor layer A2.

Figure 14:
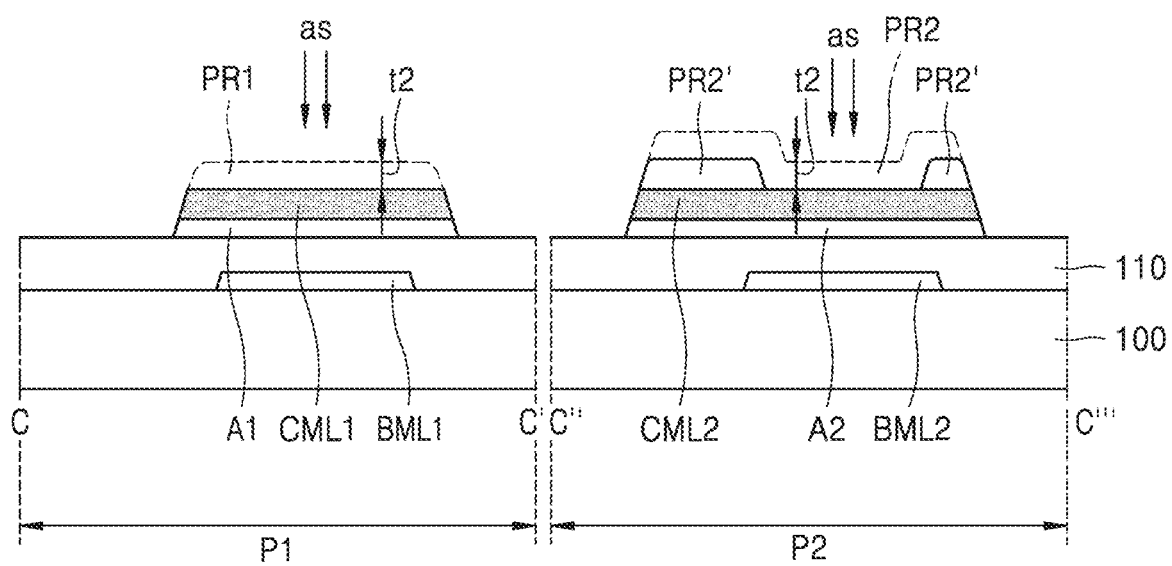

Subsequently, referring to FIG. 14, an ashing process (as) may partially or entirely remove the first photosensitive pattern PR1 and the second photosensitive pattern PR2 by as much as the second thickness t2. Consequently, the first photosensitive pattern PR1 may be entirely removed, and the second photosensitive pattern PR2 may be partially removed. Referring to FIG. 12, FIG. 13, and FIG. 14, because the second photosensitive pattern PR2 is entirely removed by the second thickness t2, the first portion (a) of the second photosensitive pattern PR2 is partially removed, and the second portion (b) is completely removed.

Figure 12:
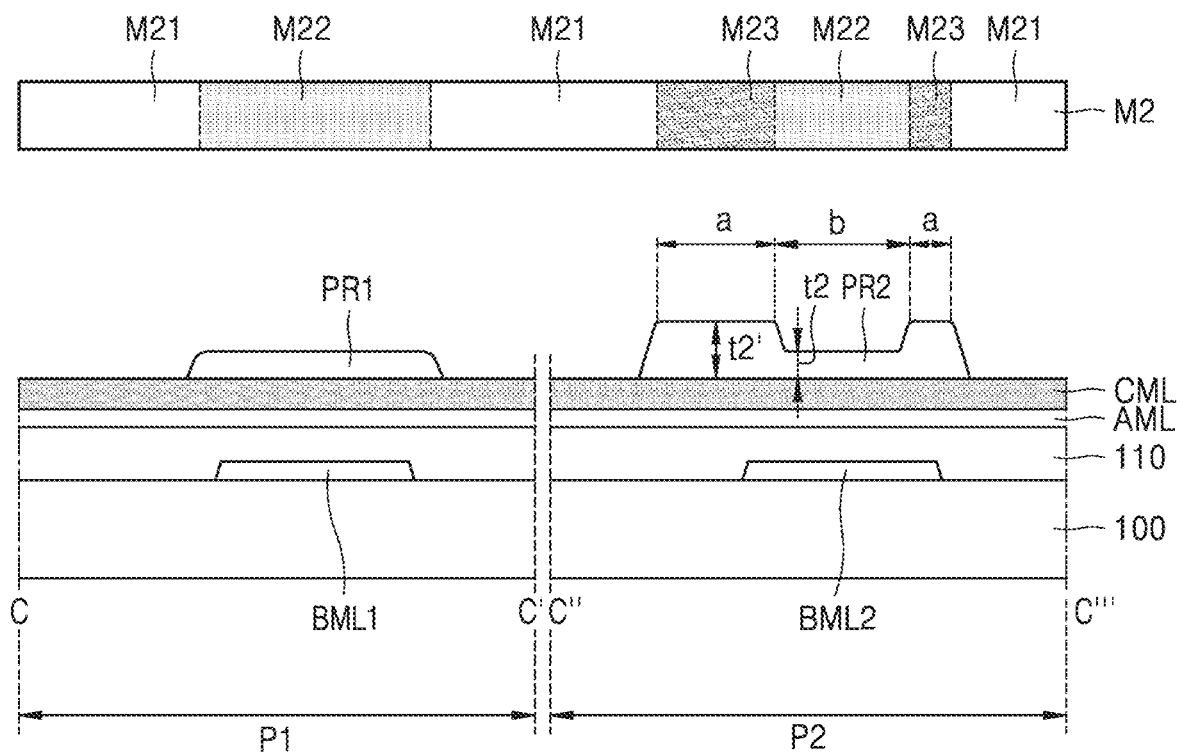

The first portion (a) of the second photosensitive pattern PR2 is partially retained as a remaining portion PR2' on the second conductive material layer CML2, as shown in FIG. 12 and FIG. 14.

Figure 15:
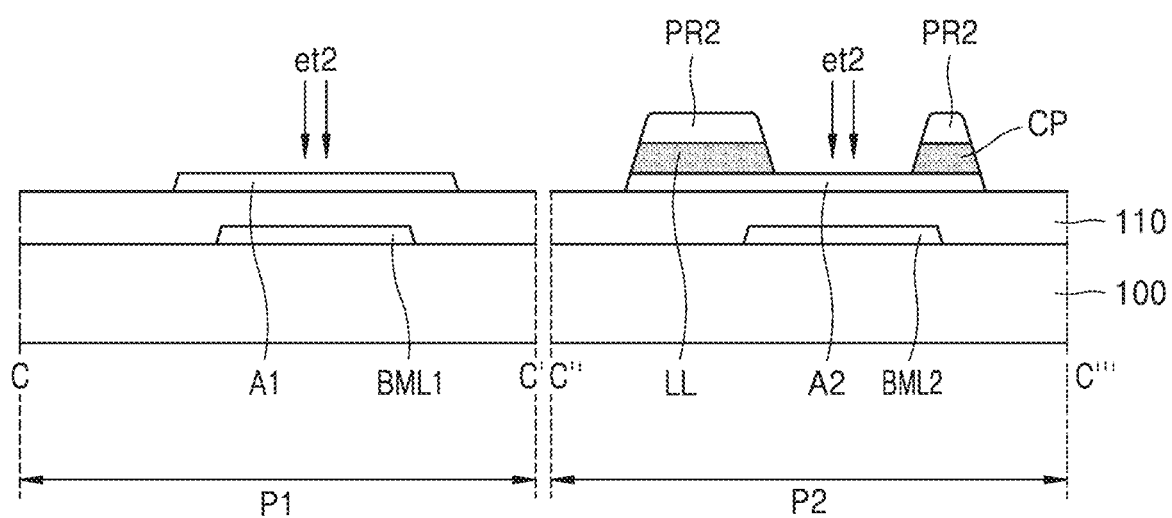

Subsequently, as shown in FIG. 15, a second etching process et2 for partially or entirely removing the first conductive material layer CML1 and the second conductive material layer CML2 may be performed. The first conductive material layer CML1 may be entirely removed, and the second conductive material layer CML2 may be partially removed by the second etching process et2. In the second conductive material layer CML2, a portion not covered by the remaining portion PR2' may be removed, and the portion(s) covered by the remaining portion PR2' may be retained and may be the lower line LL and/or the conductive pattern CP.

In FIG. 15, the lower line LL and the conductive pattern CP are at opposite ends of the second semiconductor layer A2, but the conductive pattern CP may be optional. A side of the second semiconductor layer A2 extends, and the lower line LL directly on the second semiconductor layer A2 may be part of the second data line DL2 electrically connected to the second pixel P2.

Figure 16:
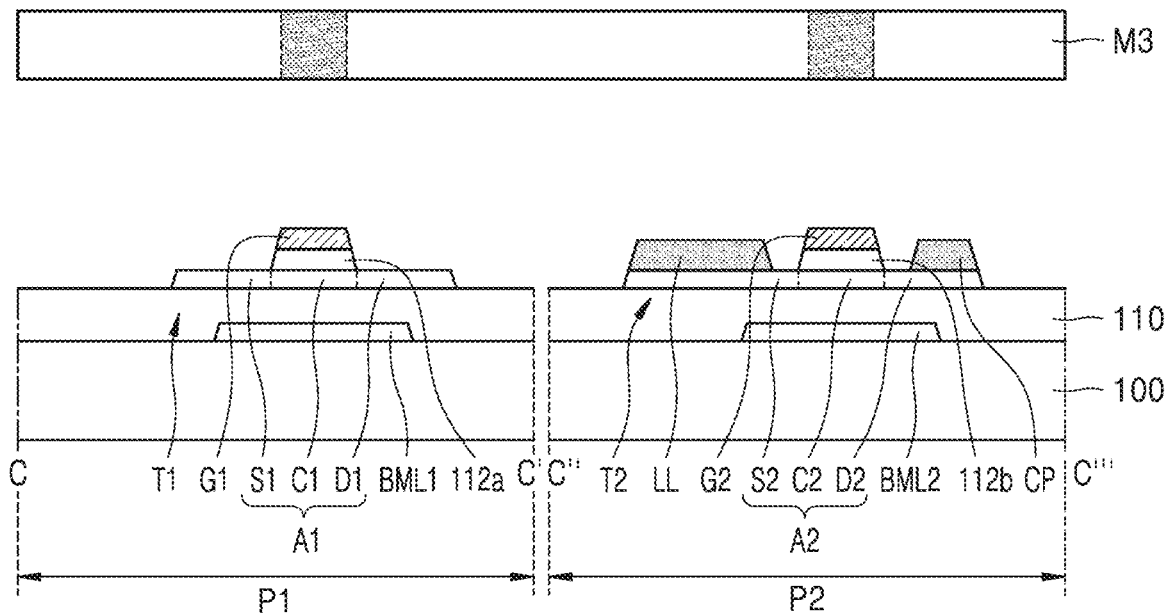

Subsequently, referring to FIG. 16, after removing the remaining portion PR2' of the second photosensitive pattern PR2, the first gate electrode G1 and the second gate electrode G2 may be formed respectively on the first semiconductor layer A1 and the second semiconductor layer A2 using a third mask M3. The first gate insulating layer 112a may be between the first semiconductor layer A1 and the first gate electrode G1, and the second gate insulating layer 112b may be between the second semiconductor layer A2 and the second gate electrode G2. The first gate electrode G1 is patterned first, and then, the first gate insulating layer 112a may be patterned using the first gate electrode G1 as a mask. Alternatively, the first gate electrode G1 and the first gate insulating layer 112a may be simultaneously patterned. Side surfaces of the first gate insulating layer 112a and the first gate electrode G1 formed through the above manufacturing processes have a same continuous etched surface, and the first gate insulating layer 112a and the first gate electrode G1 may have the same shape. Analogous features may be applied to the second gate electrode G2 and the second gate insulating layer 112b.

Subsequently, the first semiconductor layer A1 and the second semiconductor layer A2 may be doped using the first gate electrode G1 and the second gate electrode G2 as masks. Through the doping process, the first semiconductor layer A1 and the second semiconductor layer A2 may respectively include the channel regions C1 and C2, the source regions S1 and S2, and the drain regions D1 and D2. The lower line LL included in the second data line DL2 may be directly on the source region S2 of the second semiconductor layer A2.

Figure 17:
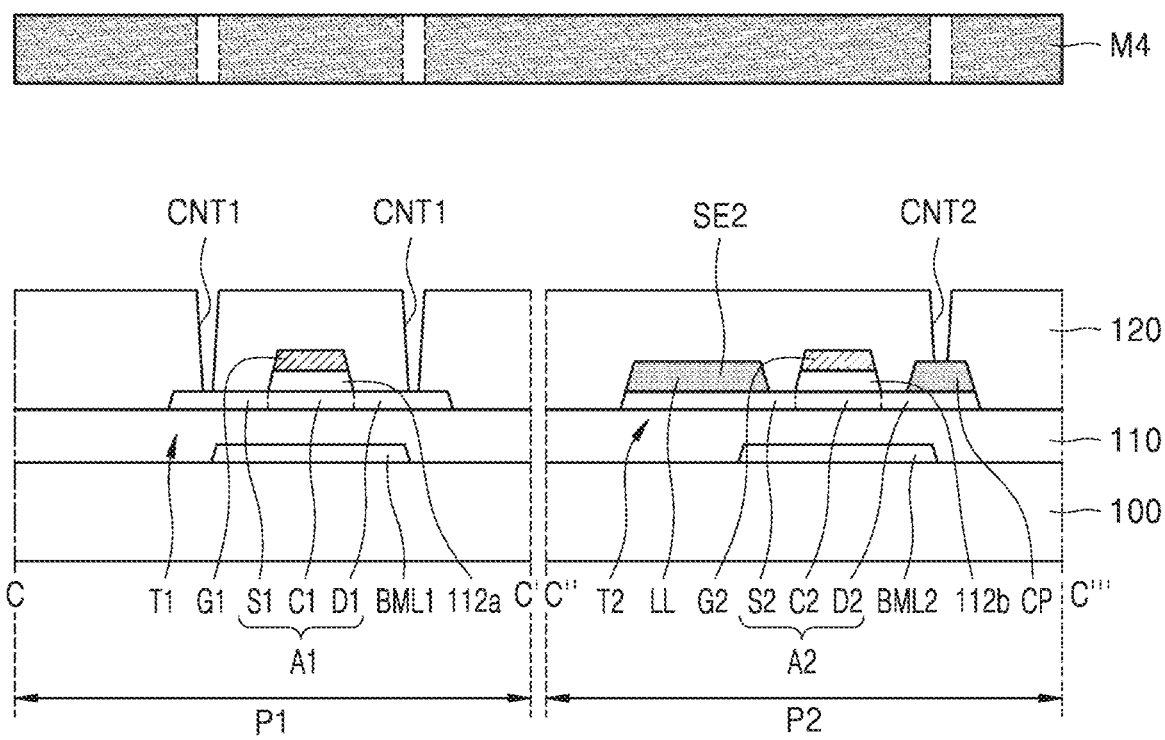
Figure 18:
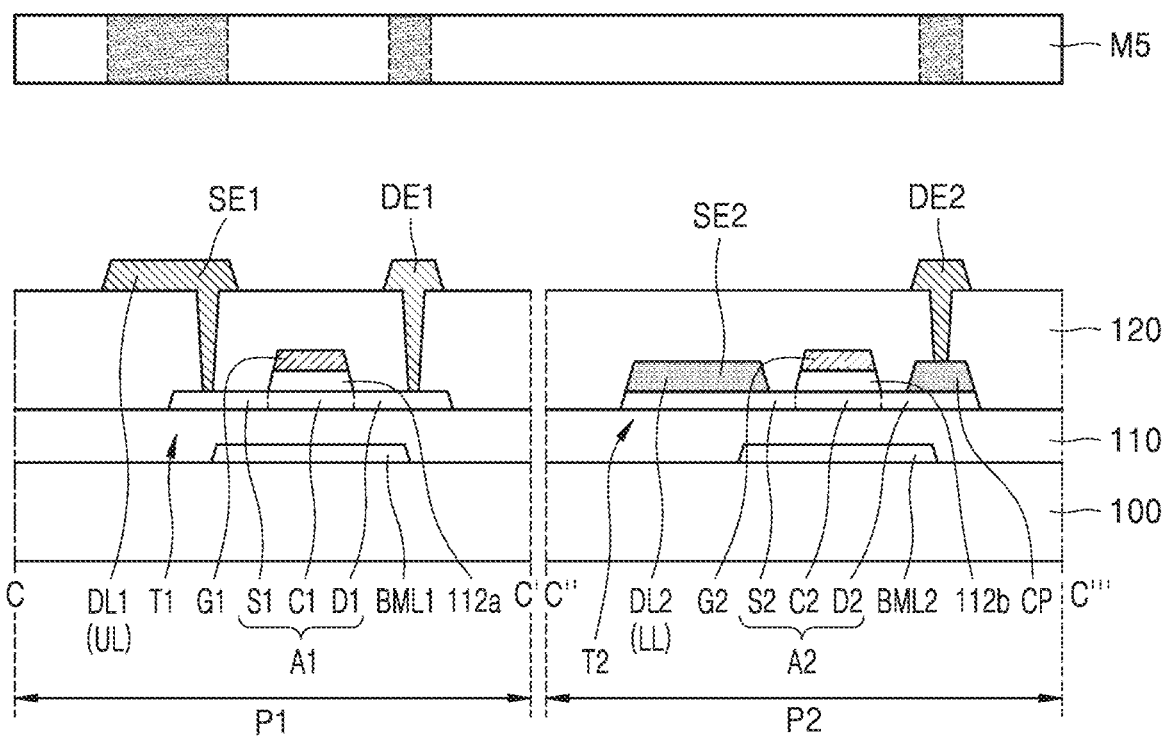

Subsequently, referring to FIGS. 17 and 18, the interlayer insulating layer 120 is formed on the first gate electrode G1 and the second gate electrode G2, and the contact holes CNT1 and CNT2 may be formed in the interlayer insulating layer 120 using a fourth mask M4. The contact holes CNT1 may partially expose the source region S1 and the drain region D1 of the first semiconductor layer A1. The contact hole CNT2 may partially expose the conductive pattern CP on the second semiconductor layer A2.

The first source electrode SE1, the first drain electrode DE1, and the second drain electrode DE2 may be formed on the contact holes CNT1 and CNT2 using a fifth mask M5. The first source electrode SE1 and the first drain electrode DE1 may respectively directly contact the source region S1 and the drain region D1 of the first semiconductor layer A1, and the second source electrode SE2 and the second drain electrode DE2 may respectively directly contact the source region S2 and the drain region D2 of the second semiconductor layer A2. The second source electrode SE2 may be directly on the source region S2 without extending through a contact hole. The second source electrode SE2 may be integrally provided with the lower line LL of the second data line DL2. In the first pixel P1, the first source electrode SE1 may function as the upper line UL of the first data line DL1; in the second pixel P2, the second source electrode SE2 may act as the lower line LL of the second data line DL2.

Figure 19:
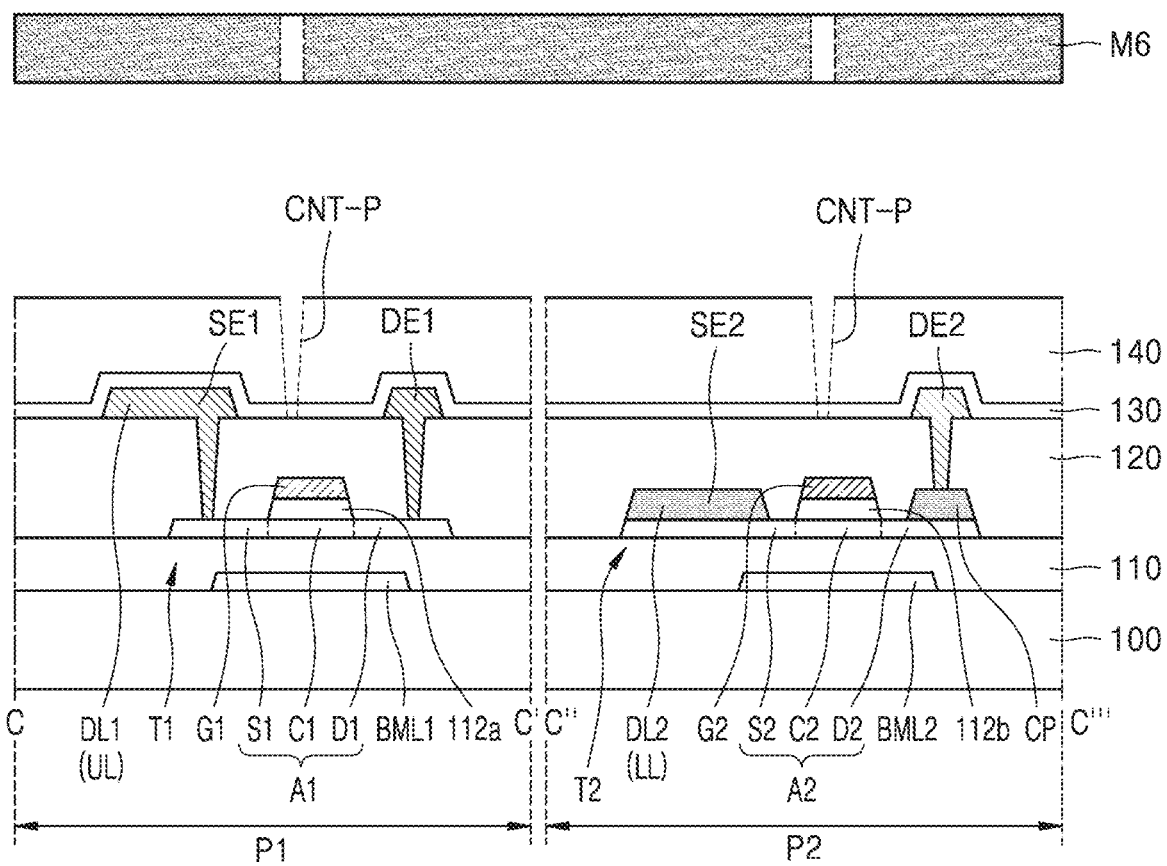

Subsequently, referring to FIG. 19, the planarization layer 140 is formed on the first thin film transistor T1 and the second thin film transistor T2, and contact holes CNT-P may be formed using a sixth mask M6. The first thin film transistor T1 and the second thin film transistor T2 may function as switching thin film transistors, and the contact hole CNT-P may be connected to the driving thin film transistor or an emission control thin film transistor. The protective layer 130 may be formed before forming the planarization layer 140.

Figure 20:
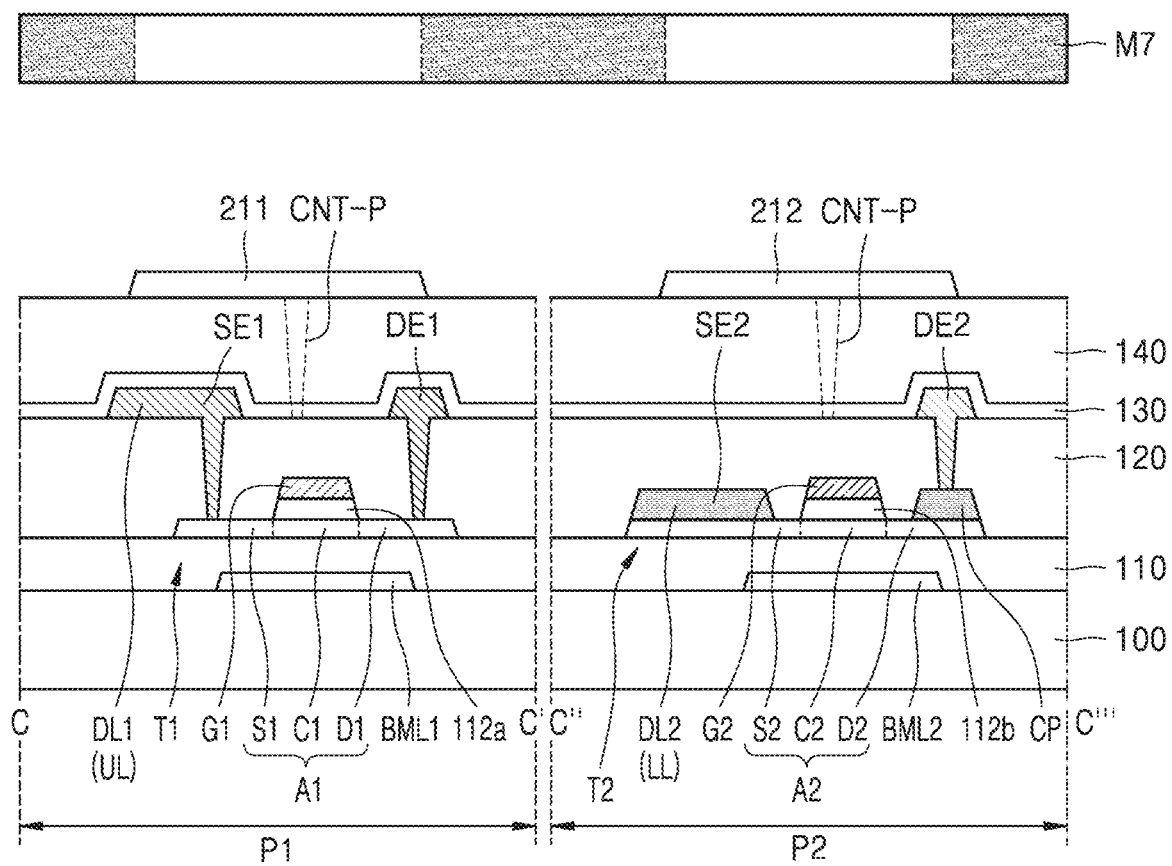

Subsequently, referring to FIG. 20, the first pixel electrode 211 and the second pixel electrode 212 may be formed using a seventh mask M7. The first pixel electrode 211 and the second pixel electrode 212 may be connected to the driving thin film transistor or the emission control thin film transistor via the contact holes CNT-P.

Figure 21:
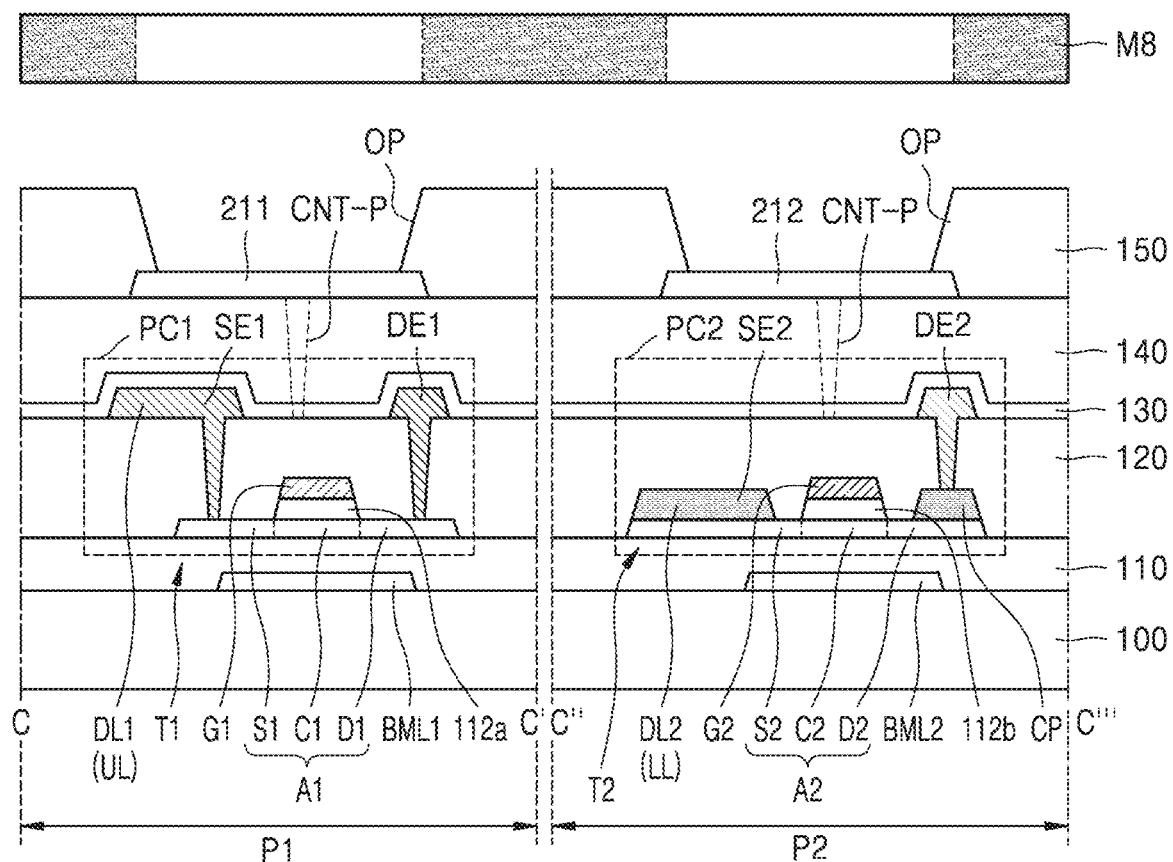

Referring to FIG. 21, a pixel defining layer 150 including openings OP respectively exposing the first pixel electrode 211 and the second pixel electrode 212 may be formed using an eighth mask M8. Referring to FIG. 6 and FIG. 21, the first emission layer 221 and the second emission layer 222 are respectively formed on the first pixel electrode 211 and the second pixel electrode 212, and the opposite electrode 230 and an encapsulation member (not shown) may be formed on the emission layers 221 and 222.

According to embodiments, for the consecutive pixels P1 to P4, each of the data lines DL1 to DL4 may have a dual-wire structure, and data signals may be alternately applied via the upper line UL and the lower line LL. Thus, a potential RC delay of the pixel circuit may be effectively minimized or prevented during the high speed driving. The first pixel P1 may receive a first data signal lastly through the upper line UL of the first data line DL1, and the second pixel P1 may receive a second data signal lastly through the lower line LL of the second data line DL2. When it the display apparatus is driven at a high speed (e.g., 120 Hz or greater, for example, 240 Hz), a potential RC delay due to the difference in the charging/discharging speeds of the pixel circuit may be effectively minimized.

According to embodiments, a display apparatus may be manufactured using masks M1 to M8 to obtain the first data line DL1 and the second data line DL2 each having a dual-wire structure. Thus, the display apparatus may be manufactured efficiently and cost-effectively.

The described example embodiments should be considered illustrative and not for purposes of limitation. Description of features associated with each embodiment should typically be considered as available for other embodiments. Various changes in form and details may be made in the example embodiments without departing from the scope defined by the following claims.

What is claimed is:

1. A display apparatus comprising:
   a substrate;
   a first pixel on the substrate and comprising a first thin film transistor, the first thin film transistor comprising a first semiconductor layer and a first gate electrode;
   a second pixel adjacent to the first pixel in a first direction, the second pixel being on the substrate and comprising a second thin film transistor, the second thin film transistor comprising a second semiconductor layer and a second gate electrode;
   a first data line positioned on the substrate, lengthwise in a second direction that is different from the first direction, including a first lower line and a first upper line, and transfers a first data signal to the first pixel, wherein the first lower line is positioned between the substrate and the first upper line, and the first upper line of the first data line transferring the first data signal to the first pixel is positioned directly on a first end of the first semiconductor layer of the first pixel;
   a first sub-lower layer including a same material as the first semiconductor layer and disposed on a same layer as the first semiconductor layer, wherein the first lower line of the first data line is in direct contact with the first sub-lower layer;
   a second data line positioned on the substrate, lengthwise in the second direction, including a second lower line and a second upper line, and transfers a second data signal to the second pixel, wherein the second lower line is positioned between the substrate and the second upper line;
   a second sub-lower layer integrally formed with an extending portion of the second semiconductor layer, wherein the second lower line of the second data line is in direct contact with the second sub-lower layer; and
   an interlayer insulating layer disposed between the second lower line and the second upper line.

2. The display apparatus of claim 1, wherein the first semiconductor layer of the first thin film transistor is formed of an oxide semiconductor material.

3. The display apparatus of claim 2, wherein the second semiconductor layer is formed of the oxide semiconductor material.

4. The display apparatus of claim 3, further comprising a semiconductor member formed of the oxide semiconductor material, wherein the first lower line is positioned directly on the semiconductor member.

5. The display apparatus of claim 1, wherein the first thin film transistor and the second thin film transistor are switching thin film transistors.

6. The display apparatus of claim 1, wherein a material of the first lower line is identical to a material of the second lower line.

7. The display apparatus of claim 1, wherein a material of the first upper line is identical to a material in the second upper line.

8. The display apparatus of claim 1, wherein the second pixel further comprises:
   a third thin film transistor including a third semiconductor layer and a third gate electrode; and
      a bridge line electrically connected to each of the second thin film transistor and the third thin film transistor, wherein a first end of the bridge line overlaps the third semiconductor layer, and wherein a second end of the bridge line overlaps the second semiconductor layer.

9. The display apparatus of claim 8, wherein the second end of the bridge line is electrically connected through the first end of the bridge line to the third gate electrode, and wherein the first end of the bridge line is electrically connected through the second end of the bridge line to the second semiconductor layer.

10. The display apparatus of claim 9, wherein a conductive member is positioned directly on a second end of the second semiconductor layer, and wherein the second end of the bridge line is directly connected to the conductive member.

11. The display apparatus of claim 10, wherein a material of the conductive member is identical to a material of the second lower line.

12. The display apparatus of claim 9, wherein the second end of the bridge line is directly connected to the second semiconductor layer.

13. The display apparatus of claim 1, further comprising a back metal layer between the substrate and the second semiconductor layer, the back metal layer overlapping the second semiconductor layer.

14. The display apparatus of claim 1, further comprising:
   a back metal layer; and
   a driving voltage line electrically connected to the back metal layer, wherein the second pixel further comprises a third thin film transistor, wherein the third thin film transistor includes a third semiconductor layer and a third gate electrode, and wherein the back metal layer is positioned between the substrate and the third semiconductor and overlaps the third semiconductor layer.

15. The display apparatus of claim 1, further comprising:
   a first gate insulating layer between the first semiconductor layer and the first gate electrode; and
   a second gate insulating layer between the second semiconductor layer and the second gate electrode, wherein a shape of the first gate insulating layer is identical to a shape of the first gate electrode, and wherein a shape of the second gate insulating layer is identical to a shape of the second gate electrode.

* * * * *